United States Patent
Oda

(10) Patent No.: US 11,145,545 B2
(45) Date of Patent: Oct. 12, 2021

(54) SEMICONDUCTOR DEVICE

(71) Applicant: TOSHIBA MEMORY CORPORATION, Tokyo (JP)

(72) Inventor: Minoru Oda, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 34 days.

(21) Appl. No.: 16/290,851

(22) Filed: Mar. 1, 2019

(65) Prior Publication Data
US 2020/0098630 A1 Mar. 26, 2020

(30) Foreign Application Priority Data
Sep. 20, 2018 (JP) .............................. JP2018-176144

(51) Int. Cl.
| | |
|---|---|
| *H01L 21/768* | (2006.01) |
| *H01L 23/528* | (2006.01) |
| *H01L 27/092* | (2006.01) |
| *H01L 27/12* | (2006.01) |
| *H01L 23/535* | (2006.01) |
| *H01L 21/8238* | (2006.01) |

(Continued)

(52) U.S. Cl.
CPC .. *H01L 21/76892* (2013.01); *H01L 21/32134* (2013.01); *H01L 21/76805* (2013.01); *H01L 21/76843* (2013.01); *H01L 21/76895* (2013.01); *H01L 21/823871* (2013.01); *H01L 23/5283* (2013.01); *H01L 23/535* (2013.01); *H01L 23/53266* (2013.01); *H01L 23/53271* (2013.01); *H01L 27/092* (2013.01); *H01L 27/1207* (2013.01)

(58) Field of Classification Search
None
See application file for complete search history.

(56) References Cited

U.S. PATENT DOCUMENTS

| | | | |
|---|---|---|---|
| 2011/0073946 A1* | 3/2011 | Theeuwen | H01L 29/456 257/344 |
| 2017/0186654 A1 | 6/2017 | Li | |
| 2017/0263639 A1 | 9/2017 | Saito et al. | |

(Continued)

FOREIGN PATENT DOCUMENTS

JP H06-061245 A 3/1994

OTHER PUBLICATIONS

N.A. Baidakova et al., "Selective Etching of Si, SiGe, Ge and Its Usage for Increasing the Efficiency of Silicon Solar Cell", ISSN 1063-7826, Apr. 17, 2017.

(Continued)

*Primary Examiner* — Latanya N Crawford Eason
(74) *Attorney, Agent, or Firm* — Foley & Lardner LLP

(57) ABSTRACT

A semiconductor device includes a semiconductor substrate, a source or drain layer provided in the semiconductor substrate, a gate insulation layer provided on a surface of the semiconductor substrate, and a gate electrode that is provided on the gate insulation layer. The semiconductor device further includes a first contact that is provided on the source or drain layer, the first contact including a stacked body in which a plurality of first layers and one or more second layers are alternately stacked, and a second contact that faces at least one of a side surface and an upper surface of the first contact disposed on the source or drain layer.

13 Claims, 17 Drawing Sheets

(51) Int. Cl.
*H01L 23/532* (2006.01)
*H01L 21/3213* (2006.01)

(56) References Cited

U.S. PATENT DOCUMENTS

2017/0338120 A1  11/2017  Kobayashi et al.
2018/0068899 A1   3/2018  Tapily et al.
2019/0319098 A1*  10/2019  Tai ..................... H01L 29/7848

OTHER PUBLICATIONS

J.T.Borenstein et.al., "A New Ultra-Hard Etch-Stop Layer for High Precision Micromachining"by IEEE Xplore.

* cited by examiner

SEMICONDUCTOR DEVICE

CROSS-REFERENCE TO RELATED APPLICATION

This application claims the benefit of and priority to Japanese Patent Application No. 2018-176144, filed Sep. 20, 2018, the entire contents of which are incorporated herein by reference.

FIELD

Embodiments described herein relate generally to a semiconductor device.

BACKGROUND

A structure and a material of a semiconductor device may be configured to improve characteristics of the semiconductor device.

DETAILED DESCRIPTION

Figure 1:
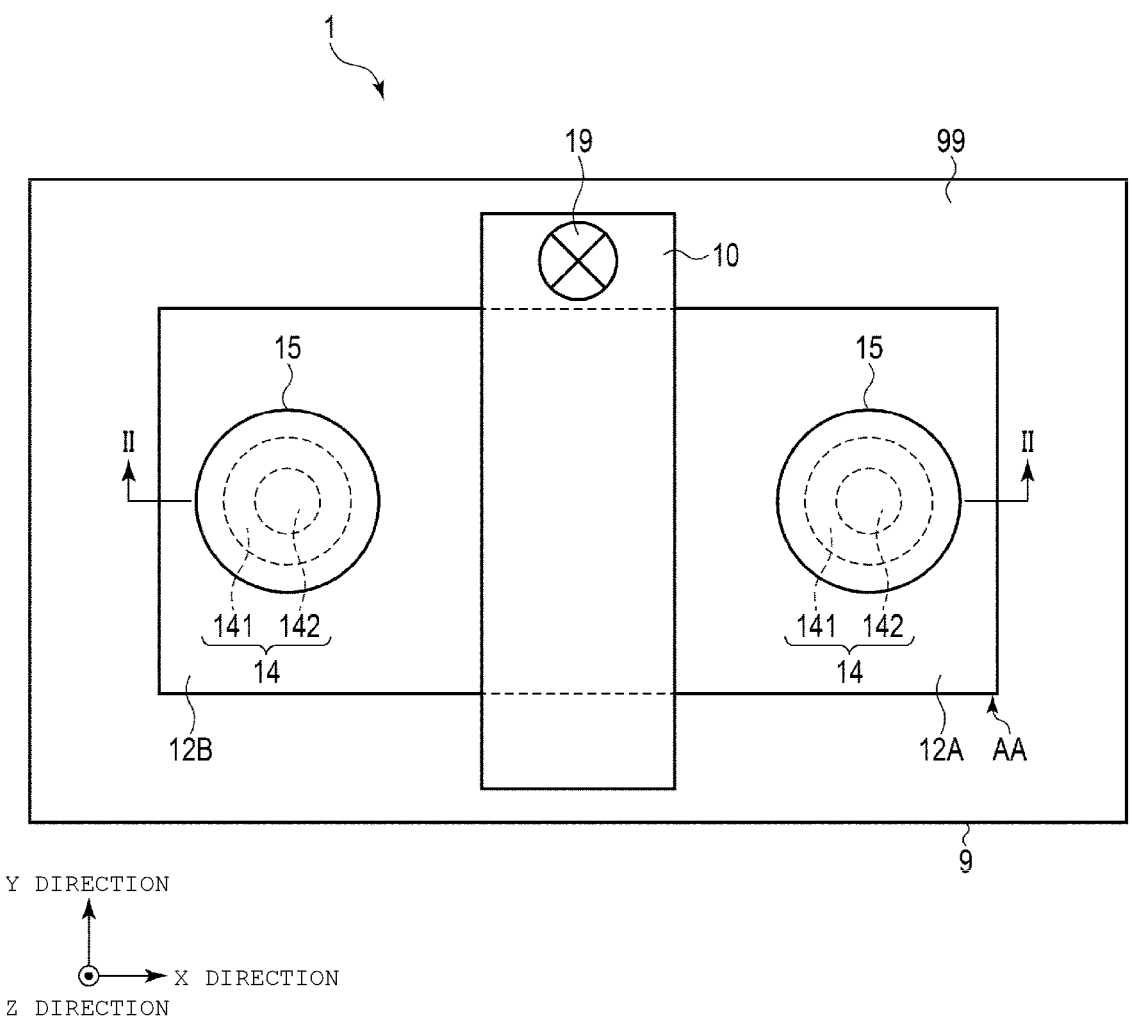
FIG. 1 is a plan view illustrating an example of a semiconductor device according to an embodiment.

Embodiments described herein provide for a semiconductor device having improved characteristics.

In general, according to one embodiment, a semiconductor device includes a semiconductor substrate; a first source or drain layer and a second source or drain layer that are provided in the semiconductor substrate; a gate insulation layer provided on a portion of a surface of the semiconductor substrate located between the first and second source or drain layers; and a gate electrode that is provided on the gate insulation layer. The semiconductor device further includes a first contact that is provided on the first source or drain layer and a first contact that is provided on the second source or drain layer, each of the first contacts including a stacked body in which a plurality of first layers and one or more second layers are alternately stacked; and a second contact that faces at least one of a side surface and an upper surface of the first contact disposed on the first source or drain layer and a side surface and an upper surface of the first contact disposed on the second source or drain layer.

Embodiment

With reference to FIG. 1 to FIG. 17, a semiconductor device according and a manufacturing method thereof according to some embodiments will be described.

In the following description, elements having the same or similar functions and configurations may be denoted by same reference numerals. In the following description, when components referred to with an alphanumeric label or reference sign (for example, word lines WL, bit lines BL, various voltages, signals, or the like) need not be distinguished from each other for the sake of the present description, a particular reference number or character may be omitted (e.g., a word line WL1 may be referred to as simply a word line WL).

Each drawing is a schematic one, and may be exaggerated (and certain features omitted) as appropriate. For example, each component may be drawn smaller or larger than the components as implemented in practice. For example, in each drawing, the dimension of the component (for example, a thickness of layer) is not limited to a magnitude relation and a dimensional ratio shown in each drawing. In addition, the number of components, the dimensional ratio, and the like may not always match between the drawings.

1. EXAMPLE EMBODIMENT

Figure 2:
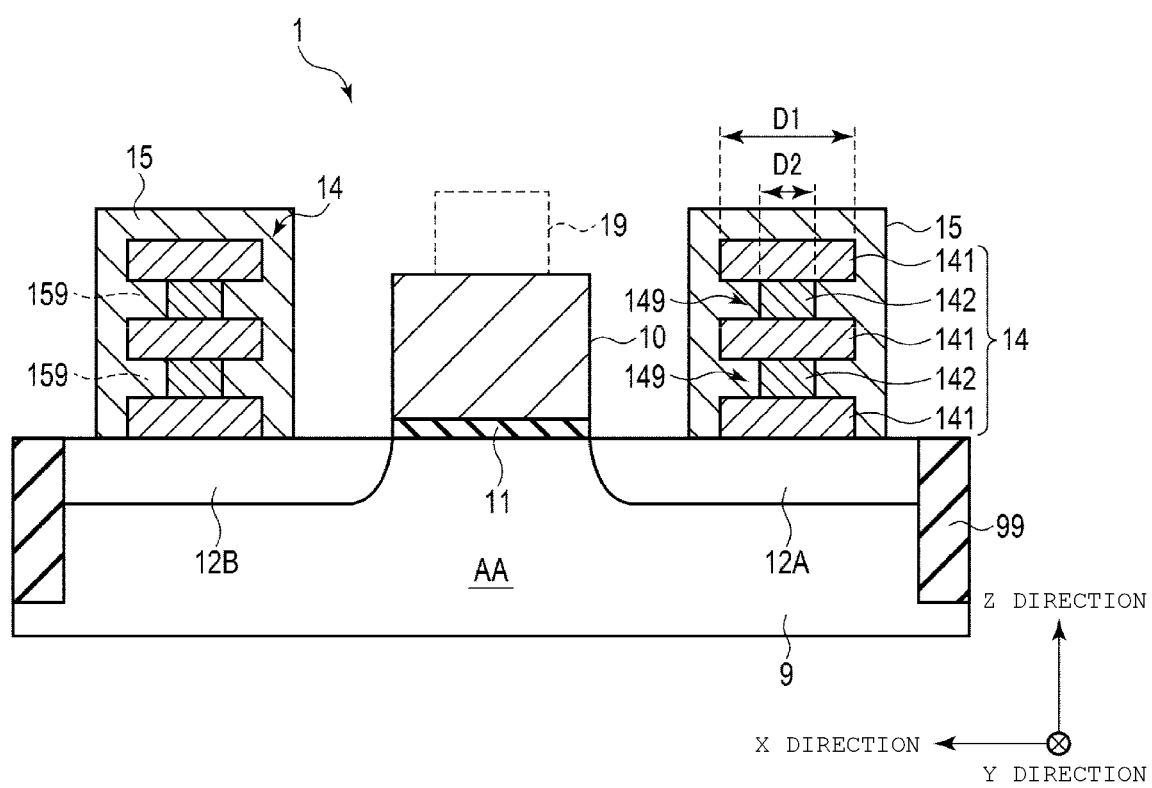
FIG. 2 is a sectional view illustrating an example of a semiconductor device according to an embodiment.
Figure 3:
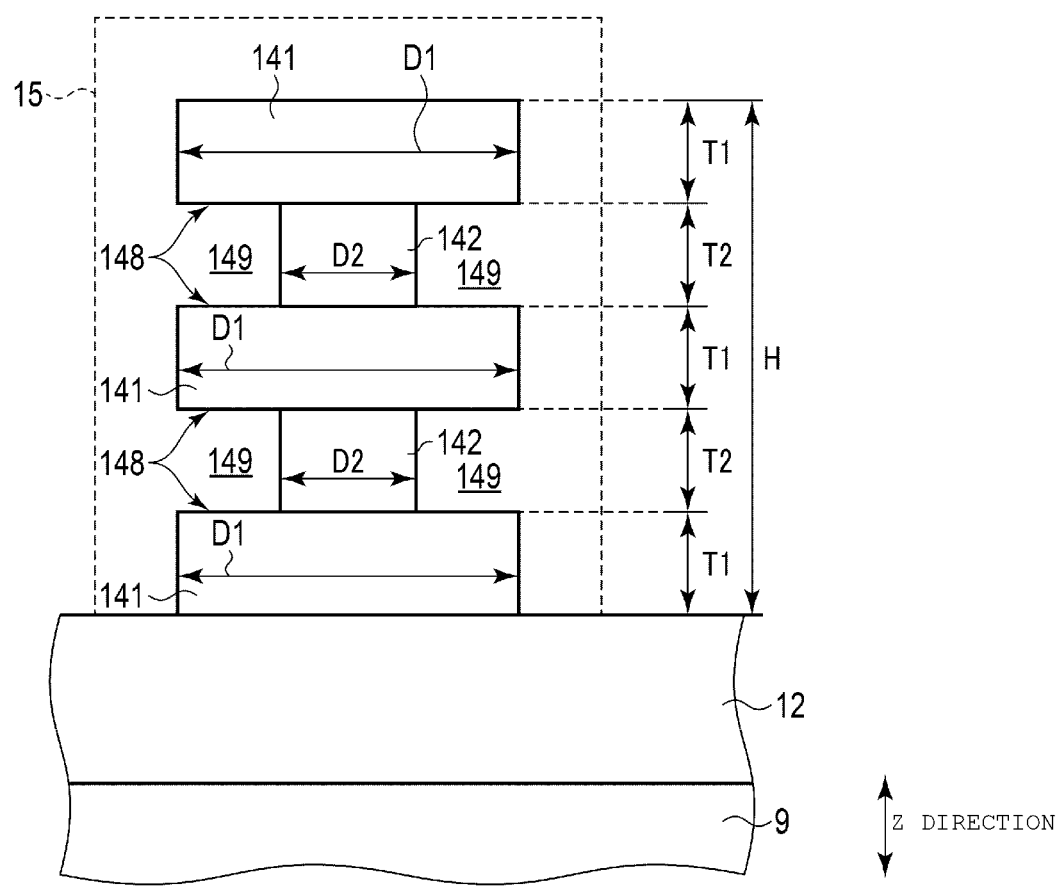
FIG. 3 is a sectional view illustrating a structure of an example of a semiconductor device according to an embodiment.

With reference to FIG. 1 to FIG. 3, an example embodiment of a semiconductor device will be described.

FIG. 1 is a top view showing an example embodiment of the semiconductor device of an embodiment. FIG. 2 is a sectional view of the semiconductor device of an embodiment showing a cross-section taken along line II-II of FIG. 1.

The semiconductor device of the present embodiment includes a field effect transistor 1. As shown in FIG. 1 and FIG. 2, the field effect transistor (hereinafter, simply, it is referred to as transistor) 1 of the present embodiment is provided in a semiconductor region AA of a semiconductor substrate 9. The semiconductor region AA is provided in a region surrounded by an insulating layer (hereinafter, it may be referred to as an element separating layer) 99 in the semiconductor substrate 9. For example, the semiconductor substrate 9 includes a silicon (Si) substrate. For example, the insulating layer 99 includes a layer (e.g., a film layer) including a silicon oxide.

In examples of FIG. 1 and FIG. 2, the field effect transistor 1 is a transistor having a planar structure.

The gate electrode 10 is disposed on the semiconductor region AA via a gate insulating film (insulating layer) 11. The gate electrode 10 extends in a Y direction (gate width direction and channel width direction). An end portion of the gate electrode 10 in the Y direction is provided on the insulating layer 99.

The gate electrode 10 includes, for example, at least one of a polycrystalline silicon, a polycrystalline germanium, a conductive silicon compound (for example, silicide), a conductive germanium compound (for example, germanide), a conductive compound (for example, titanium nitride or tantalum nitride), and a metal (for example, tungsten or copper), or an alloy thereof. The gate electrode 10 may include a stacked structure including two or more of these materials.

For example, the gate insulating film 11 includes at least one of an oxide including silicon (e.g., as a main component or being composed of over about 50%) such as $SiO_2$ and a high dielectric material (for example, a hafnium oxide and an aluminum oxide). The gate insulating film 11 may include a stacked structure including two or more of these materials.

Two source or drain layers 12 (12A and 12B) of the field effect transistor 1 are provided in the semiconductor region AA (e.g. adjacent to a surface of the semiconductor substrate 9). The two source or drain layers 12 are arranged in an X direction (a gate length direction and a channel length direction) with a channel region interposed therebetween. In a Z direction (direction perpendicular to surface of semiconductor substrate 9), the channel region faces the gate electrode 10 with the gate insulating film 11 interposed therebetween. The channel region is a semiconductor region.

The source or drain layer 12 includes n-type or p-type impurities (dopants) depending on a conductivity type (n-type or p-type) of the field effect transistor 1.

For example, when the semiconductor region AA is a silicon region (e.g., includes a silicon layer), at least one of phosphorus (P) and arsenic (As) is used for n-type dopant and boron (B) is used for p-type dopant.

Depending on whether the transistor 1 is an n-type or a p-type, the semiconductor region AA includes a region (well region) including the p-type or the n-type dopant having a lower concentration than the source or drain layer 12.

A gate contact (e.g., including a contact portion and a plug) 19 is provided on the gate electrode 10. For example, the contact 19 includes at least one of titanium, tungsten, a conductive titanium compound, and the like, or an alloy thereof. For example, the contact 19 may include a stacked structure of a barrier metal (for example, titanium nitride) and a conductor (for example, tungsten).

First contacts (e.g., including a contact portion and a plug) 14 are disposed on each of the source or drain layers 12A and 12B.

The first contact 14 includes a pillar-shaped structure. The first contact 14 includes a stacked body including a plurality of layers 141 and 142.

In the first contact 14, a first layer 141 and a second layer 142 are alternately stacked in a vertical direction (in Z direction) with respect to the front surface (e.g., a main surface) of the semiconductor substrate 9.

In the examples of FIG. 1 and FIG. 2, the first contact 14 includes three first layers 141 and two-second layers 142. In the first contact (e.g., including a stacked body) 141, the number of the first layers 141 may be two or more, and the number of the second layers 142 may be one or more.

For example, a planar shape of the first layer 141 and a planar shape of the second layer 142 are approximately quadrangular shapes (for example, approximately rectangular) or approximately circular shapes (or approximately elliptical).

When the first contact 14 is a semiconductor pillar, the material included in the first layer 141 and the material included in the second layer 142 may be different from each other. For example, with respect to materials included in the first and second layers 141 and 142, materials providing for a relatively large etching selectivity between the first layer 141 and the second layer 142 under certain etching conditions may be selected.

For example, a material included in the first and second layers 141 and 142 is a semiconductor material. A material included in the first layer 141 is selected from silicon (Si), germanium (Ge), silicon germanium (SiGe), and the like, or an alloy thereof. For a material included in the second layer 142, a material of which an etching selection ratio is selected with respect to the material included in the first layer 141 among Si, Ge, and SiGe, or an alloy thereof, may be implemented.

The lowermost first layer 141 among a plurality of the first layers 141 is in contact with the source or drain layers 12A and 12B (semiconductor region AA). The lowermost first layer 141 may be a layer contiguous to the semiconductor region AA (source or drain layer 12).

The lowermost second layer 142 among a plurality of the second layers is provided between the lowermost first layer 141 and the second first layer 141 from a substrate side.

A dimension D2 of the second layer 142 in the parallel direction (X direction and/or Y direction) with respect to the front surface of the semiconductor substrate 9 is smaller than a dimension D1 of the first layer 141 in the parallel direction with respect to the front surface of the semiconductor substrate 9. For example, D1 is larger than D2 by a factor of about 1.5 or more, about 2 or more, or about 3 or more, or by a factor in a range of about 1.1 to about 3. Thus, the second layer 142 may have a smaller footprint on the semiconductor substrate 9 than does the first layer 141. This may be true for each of the second layers 142 included in the first contact 14.

However, in some embodiments the dimension D2 of the second layer 142 in FIG. 1 and FIG. 2 may be greater than the dimension D1 of the first layer 141 depending on the manufacturing process of the field effect transistor. For example, the dimension D2 is larger than the dimension D1 by a factor of about 1.5 or more, about 2 or more, or about 3 or more, or by a factor in a range of about 1.1 to about 3. This may be true for each of the second layers 142 included in the first contact 14.

When the first and second layers 141 and 142 have a planar shape of the rectangular shape, the magnitude relation of the dimension of respect layers 141 and 142 in the parallel direction with respect to the front surface of the semiconductor substrate 9, is set by at least one of rectangular diagonal lines in the X direction and the Y direction, and in the parallel direction with respect to the front surface of the semiconductor substrate 9.

Hereinafter, in the vertical direction (Z direction) with respect to the front surface of the semiconductor substrate 9, a semiconductor substrate 9 side is referred to as "lower", and the opposite side of the semiconductor substrate 9 side (lower side) is referred to as "upper". Hereinafter, a surface on the semiconductor substrate side in the first layer 141 and the second layer 142 in the Z direction is referred to as a lower surface (or bottom surface), and a surface opposite side of the semiconductor substrate side in the first layer 141 and the second layer 142 in the Z direction is referred to as the upper surface. The upper surface of the first layer 141 faces the lower surface of the first layer 141 in the Z direction. The upper surface of the second layer 142 faces the lower surface of the second layer 142 in the Z direction.

With respect to two first layers 141 with the second layer 142 interposed therebetween, the lower surface of one of the first layer 141 is in contact with the upper surface of the second layer 142 and the upper surface of the other of the first layer 141 is in contact with the lower surface of the second layer 142.

A portion of the upper surface of the first layer 141 below the second layer 142 and a portion of the lower surface of the first layer 141 above the second layer 142 are exposed from the second layer 142.

As described above, due to a dimensional difference between the first layer 141 and the second layer 142 in the X direction and the Y direction, the contact 14 includes recesses (grooves) 149 at positions of the second layer 142.

In the Z direction, the upper surface of the first contact 14 is disposed at a position (high position) above an interface (e.g., a boundary) between the gate electrode 10 and the gate insulating film 11. In the Z direction, the upper surface of the first contact 14 may be disposed at a position above the upper surface of the gate electrode 10.

Second contacts (e.g., including a contact portion and a plug) 15 are disposed on the upper surface of the first contact 14 and on a side surface. The second contact 15 covers the first contact 14. The second contact 15 faces the upper surface of the first contact 14 and the side surface. As described above, the second contact 15 surrounds an outer periphery (upper surface and side surface) of the first contact 14.

The second contact 15 is provided in a space (recess 149 of first contact 14) between two first layers 141 positioned at a position of the second layer 142. The second contact 15 includes a plurality of protrusion portions 159. The protrusion portion 159 protrudes to a first contact 14 side in a portion corresponding to a position of the second layer 142, in the parallel direction with respect to the front surface of the semiconductor substrate 9. The protrusion portion 159 may be disposed between two of the first layers 141 and adjacent to one of the second layers 142.

As a result, the second contact 15 is in contact with a portion of the lower surface of the first layer 141 of an upper side and a portion of the upper surface of the first layer 141 of a lower side while the two first layers 141 interpose second layer 142 therebetween. Thus, a facing or contact area between the second contact 15 and the first contact 14, can be increased.

When the dimension D2 of the second layer 142 is greater than the dimension D1 of the first layer 141, the upper surface and lower surface not covered by the first layer 141 of the second layer 142 face the protrusion portion 159 of the second contact 15. In this case, in a portion corresponding to the second layer 142 of the first contact 14, the recess 149 is provided in the first contact 14. The recess 149 may be defined by a side surface of the first contact 14, and may be disposed adjacent to one of the second layers 142.

For example, a material included in the second contact 15 is at least one of a metal such as titanium (Ti) and tungsten (W), or a conductive compound such as titanium nitride (TiN). The second contact 15 may include a stacked structure of these materials.

The first and second contacts 14 and 15 are provided in a contact hole of an interlayer insulating film (not shown).

Figure 4:
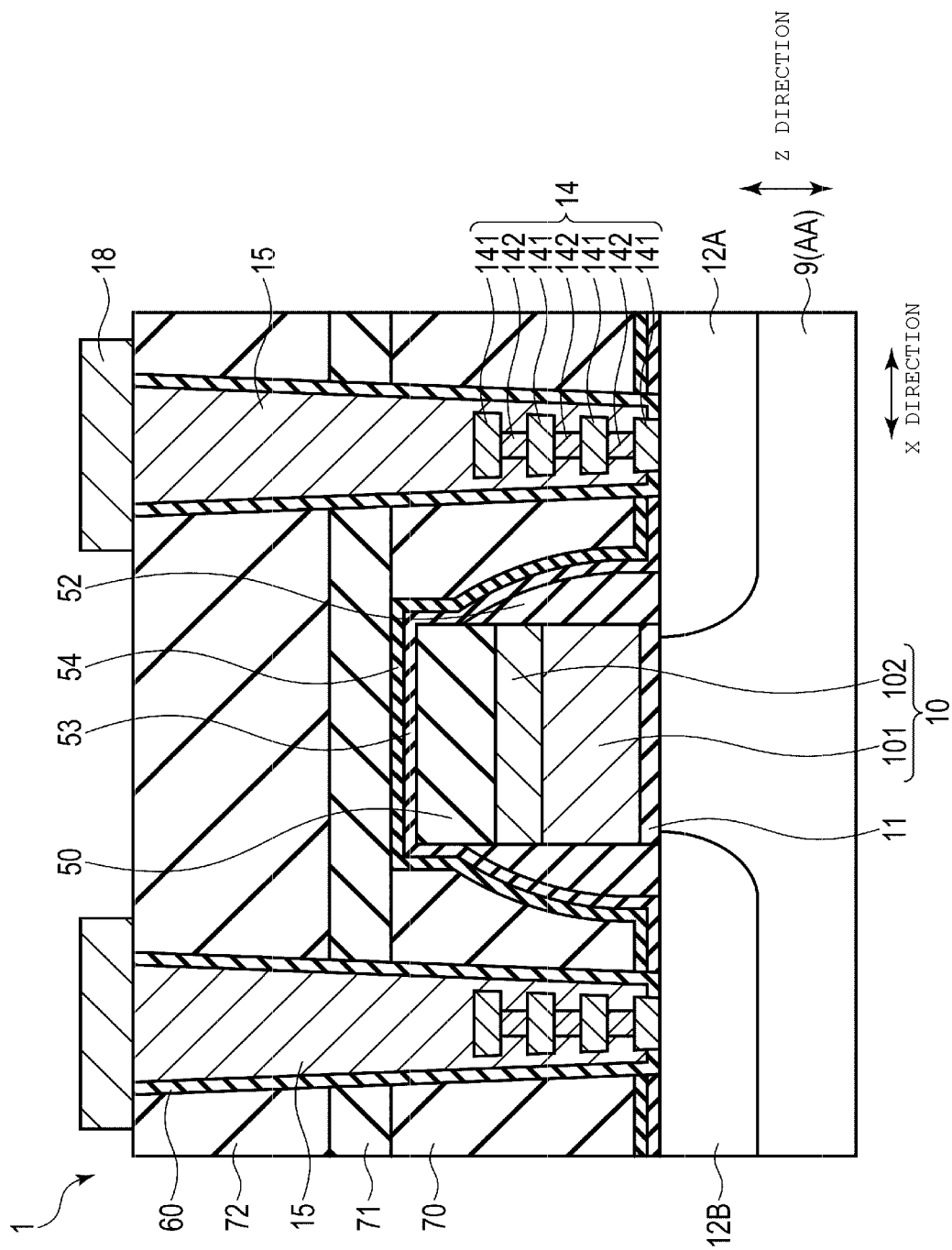
FIG. 4 is a diagram illustrating a semiconductor device according to an embodiment.

A wire (e.g., a conductive layer) 18 (e.g., as shown in FIG. 4) is provided on a contact 15 and on the interlayer insulating film. The wires 18 are connected to the source or drain layers 12A and 12B and the gate electrode 10 via the contacts 14, 15, and 19. The wire 18 is a metal layer including, for example, aluminum (Al) and copper (Cu).

FIG. 3 is a schematic diagram illustrating a contact structure of the field effect transistor of the present embodiment.

In FIG. 3, the contact of the field effect transistor 1 of the present embodiment shown. The contact 14 (and contact 15) is provided on the source or drain layer 12 of the transistor 1.

In the field effect transistor 1 of the present embodiment, as described above, the first contact 14 includes the stacked body in which the first layer 141 and the second layer 142 are alternately stacked in the Z direction. The contact 14 includes a plurality of the first layers 141 (for example, three) and a plurality of the second layers 142 (for example, two).

Here, it is assumed that the first layer 141 and the second layer 142 include a cylindrical structure. The first and second layers 141 and 142 have a cylindrical planar shape. A diameter (e.g. a maximum dimension in X direction) of the first layer 141 is described as "D1". The diameter (e.g. a maximum dimension in X direction) of the second layer 142 is described as "D2".

The thickness (dimension of first layer in Z direction) of the first layer 141 is described as "T1". The thickness (dimension second layer in Z direction) of the second layer 142 is described as "T2".

The diameter D1 is greater than the diameter D2. For example, D1 is larger than D2 by a factor of about 1.5 or more, about 2 or more, or about 3 or more, or by a factor in a range of about 1.1 to about 3. A dimension difference between the first layer 141 and the second layer 142 in the parallel direction with respect to the front surface of the semiconductor substrate is "D1−D2". The height H of the first contact (stacked body) 14 is 3×T1+2×T2.

The area of the upper surface of the first layer 141 in the Z direction is $\pi \times D1^2/4$. The area of the lower surface of the first layer 141 is substantially the same as the area of the upper surface of the first layer.

The area of the upper surface of the second layer 142 in the Z direction is $\pi \times D2^2/4$. The area of the lower surface of the second layer 142 is substantially the same as the area of the upper surface of the second layer 142.

When the dimension D2 of the second layer 142 is smaller than the dimension D1 of the first layer 141, there is a region (portion) not covered by the second layer 142 in the stacked body of the first contact 14 and in the upper surface of the first layer 141 and the lower surface.

With respect to one surface in contact with the second layer 142 in the first layer 141, the area of a region (exposed surface of first layer 141) 148 not covered by the second layer 142 on the surface satisfies $\pi (D1^2-D2^2)/4$.

A region (portion) 148 not covered by the second layer 142 in the upper surface and the lower surface of the first layer 141 is in contact with the second contact 15 (protrusion portion 159 of contact 15).

Due to contact between the region 148 and the second contact 15 in the first layer 141, a contact area between the first contact 14 and the second contact 15 increases. The contact area increases depending on the number of stacked layers of the first and second layers 141 and 142 in the stacked body 14.

As shown in FIG. 2 and FIG. 3, when the contact (stacked body) 14 includes three first layers 141 and two second layers 142, the total area of the exposed surface 148 of the plurality of the first layers 141 in a portion corresponding to the recess 149 of the stacked body 14 is $\pi \times (D1^2-D2^2)$.

Here, the height of the stacked body 14 is described as "H". In examples shown in FIG. 2 and FIG. 3, they are satisfied by $H=3\times T1+2\times T2$. A value of "H" varies according to the number of the first and second layers 141 and 142, the thickness T1 of the first layer 141, and the thickness T2 of the second layer 142 in the stacked body 14.

In the present embodiment, the contact area (facing area) between the contact 14 including the recess 149 and the contact 15 including the protrusion portion 159 satisfies $3\pi \times T1 \times D1 + 2\pi \times T2 \times D2 + \pi \times D1^2/4 + \pi \times (D1^2-D2^2)$.

For example, with respect to two contacts, the contact area of the two contacts is between the upper surface of one contact and the lower surface of the other contact. In this case, when the diameter of the contact is d, the contact area of the two contacts is $\pi \times d^2/4$.

As described above, in the present embodiment, depending on the dimension difference (D1−D2) between the first layer 141 and the second layer 142 forming the first contact, the contact area of the first contact 14 and the second contact 15 increases.

Therefore, in the present embodiment, the field effect transistor can provide for a reduced resistance between the wire and the transistor (for example, contact and source or drain layer of transistor).

As a result, the semiconductor device of the present embodiment can have improved characteristics.

2. EXAMPLE

With reference to FIG. 4 to FIG. 14, an example of a field effect transistor according to an embodiment and a manufacturing method according to an embodiment will be described.

A. Structure Example

With reference to FIG. 4, an example structure of the field effect transistor according to an embodiment will be described.

FIG. 4 is a sectional view illustrating the example structure of the field effect transistor according to an embodiment.

As shown in FIG. 4, the field effect transistor 1 includes the gate electrode 10, the source or drain layer 12 (12A and 12B), and the gate insulating film 11.

As described above, the gate electrode 10 is provided on the channel region of the semiconductor region AA via the gate insulating film 11.

The gate electrode 10 includes the stacked structure. The gate electrode 10 includes two conductive layers 101 and 102. The conductive layer 101 is provided on the gate insulating film 11. The conductive layer 102 is provided on the conductive layer 101. For example, the conductive layer 101 is a conductive polysilicon layer to which impurities (dopants) are added. For example, the conductive layer 102 is a layer including silicide.

An insulating layer 50 is provided on the layer 102.

Hereinafter, the stacked body including the conductive layers 101 and 102 and the insulating layer 50 is also called as a gate stack (or simply, gate electrode).

The sidewall insulating layer 52 is provided on the side surface (gate stack surface in X direction) of the gate stack. For example, the bottom portion of the sidewall insulating layer 52 is in contact with the semiconductor region AA. The sidewall insulating layer 52 is a layer including silicon oxide.

The insulating layers 53 and 54 are provided on the insulating layer 52 to cover the gate stacks 10 and 50.

The source or drain layer 12 is provided in the semiconductor region AA. When a conductivity type of the field effect transistor is the p-type, the source or drain layers 12A and 12B are impurity semiconductor regions (p+ type semiconductor region and p+ type diffusion layer) including boron (B). In this case, the semiconductor region AA includes the impurity semiconductor region (well region) including arsenic (As) and/or phosphorus (P). The source or drain layer 12 includes relatively high concentration conductive dopants. The semiconductor region AA includes relative low concentration conductive dopants. In the p-type transistor, it is preferable that the conductive layer 101 includes a p-type polysilicon layer.

When the conductivity type of the field effect transistor is the n-type, the source or drain layers 12A and 12B are the impurity semiconductor regions including As and/or P, and the semiconductor region AA is the impurity semiconductor region (n+ type semiconductor region and n+ type diffusion layer) including B. In an n-type transistor, it is preferable that the conductive layer 101 includes an n-type polysilicon layer.

The first contact 14 is provided on the source or drain layer 12.

The first contact 14 includes a structure in which the plurality of the first layers 141 and the plurality of the second layers 142 are alternately stacked in the Z direction. In an example of FIG. 4, four first layers 141 and three-second layers 142 are provided in the contact 14. For example, the first layer 141 is a silicon germanium layer (SiGe). The second layer 142 includes the silicon layer (Si layer). The first and second layers 141 and 142 are epitaxial layers (crystal layer). As described above, as an example, the contact 14 is formed from the semiconductor pillar. The Si layer may be used in the first layer 141 and the SiGe layer may be used in the second layer 142.

The dimension (diameter) D2 of the second layer 142 in the X direction (or Y direction) is smaller than the dimension D1 of the first layer 141 in the X direction (Y direction). For example, a ratio (D1/D2) of the dimension D1 and the dimension D2 is set in a range from about 1.1 to about 3.0.

The first layer 141 has the thickness T1. The second layer 142 has the thickness T2. The thickness T1 of the first layer 141 may be substantially the same as or may be different from the thickness T2 of the second layer 142. In the plurality of the first layers, the thicknesses of the layers 141 may be different from each other. In the plurality of second layers 142, the thicknesses of respective layers 142 may be different from each other.

In the plurality of the first layers 141, in some embodiments, the dimensions D1 of respective layers 141 are different from each other according to a position in the Z direction. For example, the dimension of the lowermost first layer 141 among the plurality of the first layers 141 in the stacked body (contact) 14 is equal to or smaller than (e.g. by a factor of about 0.9 or less, about 0.7 or less, or about 0.5 or less) the dimension of the uppermost first layer 141. Similarly, in the plurality of second layers 142, the dimensions D2 of respective layers 142 may be different from each other according to a position in the Z direction. For example, the dimension of the lowermost second layer among the plurality of second layers 142 in the stacked body 14 is equal to or smaller than the dimension of the uppermost second layer (e.g. by a factor of about 0.9 or less, about 0.7 or less, or about 0.5 or less).

The contact (stacked body) 14 includes or defines the recess 149 in a portion corresponding to the second layer.

The insulating layer 70 is provided on the semiconductor substrate 9 to cover the gate stacks 10 and 50. The insulating layers 71 and 72 are stacked on the insulating layer 70. The insulating layers 70, 71, and 72 are interlayer insulating films. The silicon oxide layer, a silicon nitride layer, a silicon oxynitride layer, and the like are appropriately implemented with the insulating layers 70, 71, and 72.

The second contact 15 is provided in the contact hole in the insulating layers 70, 71, and 72. A spacer layer (insulating layer) 60 is provided between the second contact 15 and the insulating layers 70, 71, and 72.

In the contact hole, the second contact 15 is connected to the first contact 14. The second contact 15 is in contact with the upper surface of the first contact 14 and the side surface of the first contact 14.

The second contact 15 includes the protrusion portion 159 at a position (position of second layer 142) corresponding to the recess 149 of the first contact 14. The protrusion portion 159 is interposed by portions of two first layers 141 in the Z direction. Accordingly, the second contact 15 is in contact (facing) with the lower surface of one layer 142 and the upper surface of the other layer 141 in two first layers 141 with one second layer 142 interposed therebetween in the recess 149.

For example, the spacer layer 60 is provided between the second contact 15 and the source or drain layer 12. Therefore, the second contact 15 is not in contact with the source or drain layer 12. According to some example manufacturing processes, the spacer layer 60 may be omitted, and may not be provided between the second contact 15 and the source or drain layer 12.

The wire (metal layer) 18 is provided on the second contact 15 and an insulating layer 72.

B. Manufacturing Method

With reference to FIG. 4 to FIG. 14, a manufacturing method of the present embodiment will be described. FIG. 5 to FIG. 14 are sectional process diagrams showing examples of the manufacturing method of the field effect transistor of the present embodiment. Hereinafter, although a manufacturing method of a p-type field effect transistor (for example, MOS transistor) is described, the n-type field effect transistor is also formed substantially with a similar process.

Figure 5:
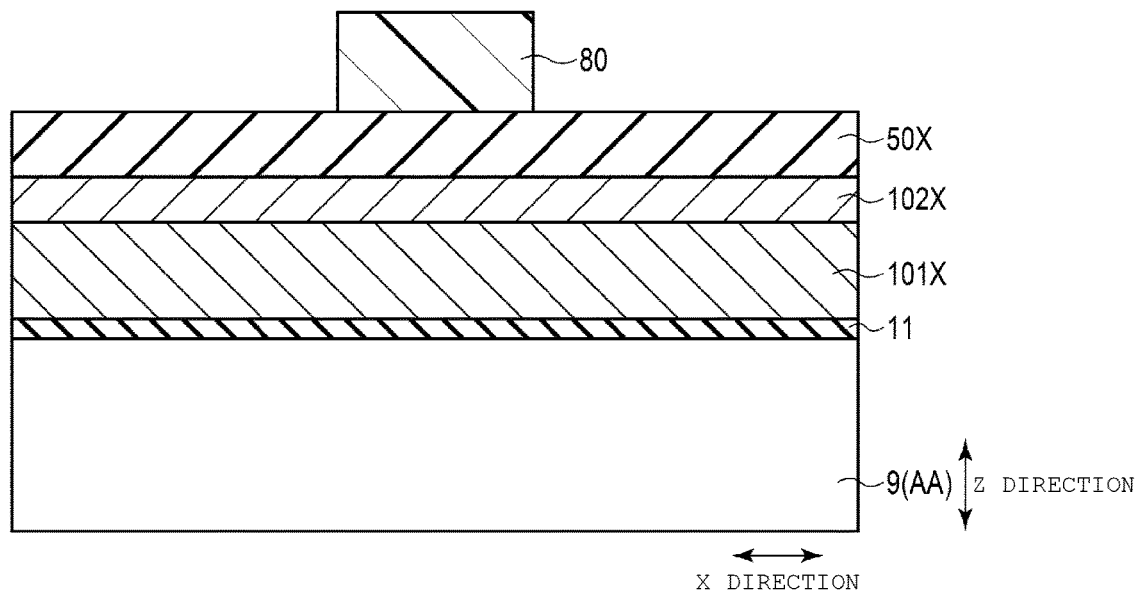
FIG. 5 is a sectional process diagram illustrating a method for manufacturing a semiconductor device according to an embodiment.

As shown in FIG. 5, the gate insulating film 11 is formed on the semiconductor region AA in the semiconductor substrate 9.

A semiconductor layer 101X is formed on the gate insulating film 11. For example, the semiconductor layer 101X is a layer including polysilicon.

A conductive layer 102X is formed on the semiconductor layer 101X. For example, the conductive layer includes a silicide layer. The silicide layer is formed as described below. A metal layer (not shown) is formed on the polysilicon layer 101X. Heat treatment is performed on the polysilicon layer 101X and the metal layer. Accordingly, a silicide layer 102X is formed on the polysilicon layer 101X by a chemical reaction between polysilicon and the metal. A portion of the metal layer which is not reacted with the polysilicon may be removed or may remain on the silicide layer 102X.

The insulating layer 50X is formed on the silicide layer 102X. A mask layer (for example, resist mask) 80 is formed on the insulating layer 50X. The mask layer 80 is patterned to include a predetermined pattern by photolithography and etching (e.g., patterned to have a gate pattern).

Based on the mask layer having a gate pattern, the insulating layer 50X, the silicide layer 102X, and the polysilicon layer 101X are etched by, for example, reactive ion etching (RIE).

Figure 6:
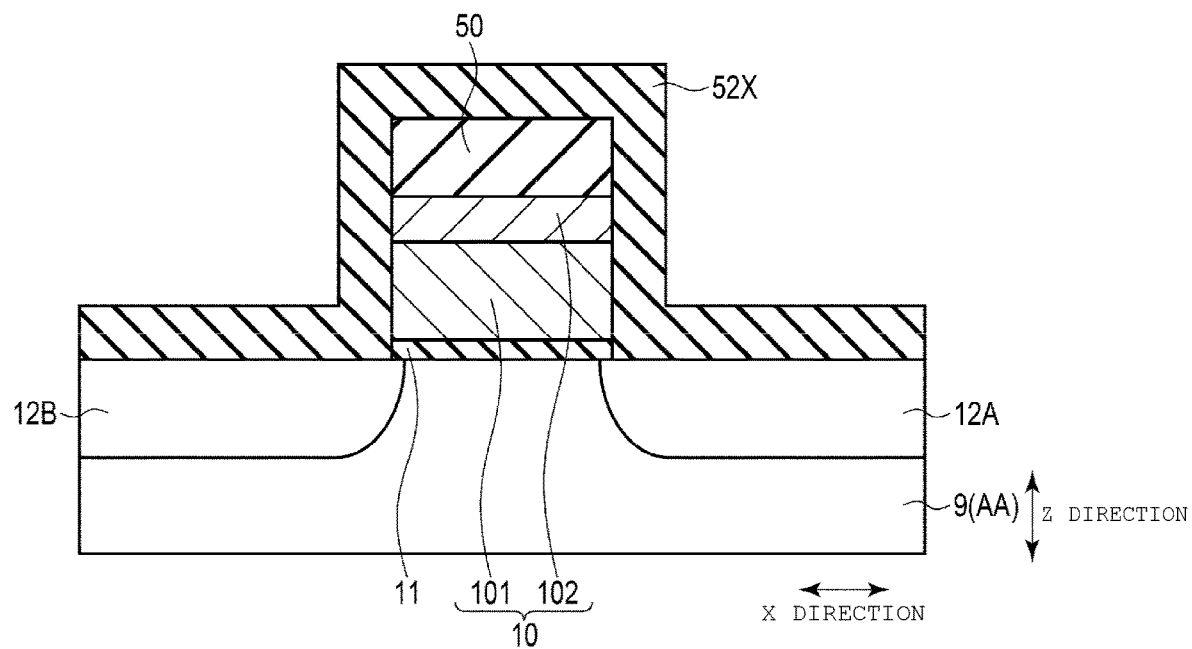
FIG. 6 is another sectional process diagram illustrating a method for manufacturing a semiconductor device according to an embodiment.

Accordingly, as shown in FIG. 6, the gate electrode 10 is formed on the gate insulating film 11.

Ion implantation is performed on the semiconductor region AA by using the gate electrode 10 as a mask. For example, boron (B) is used as an ion species for the ion implantation.

Accordingly, source or drain layers (diffusion layer) 12A and 12B are formed in the semiconductor region AA in a self-aligned manner on the gate electrode 10. The source or drain layer 12 (12A and 12B) include the p+ type semiconductor region including the boron.

After the source or drain layers 12A and 12B are formed, an insulating layer (for example, a silicon oxide layer) 52X is formed to cover the gate stacks 10 and 50. The etching is performed on the insulating layer 52X.

Figure 7:
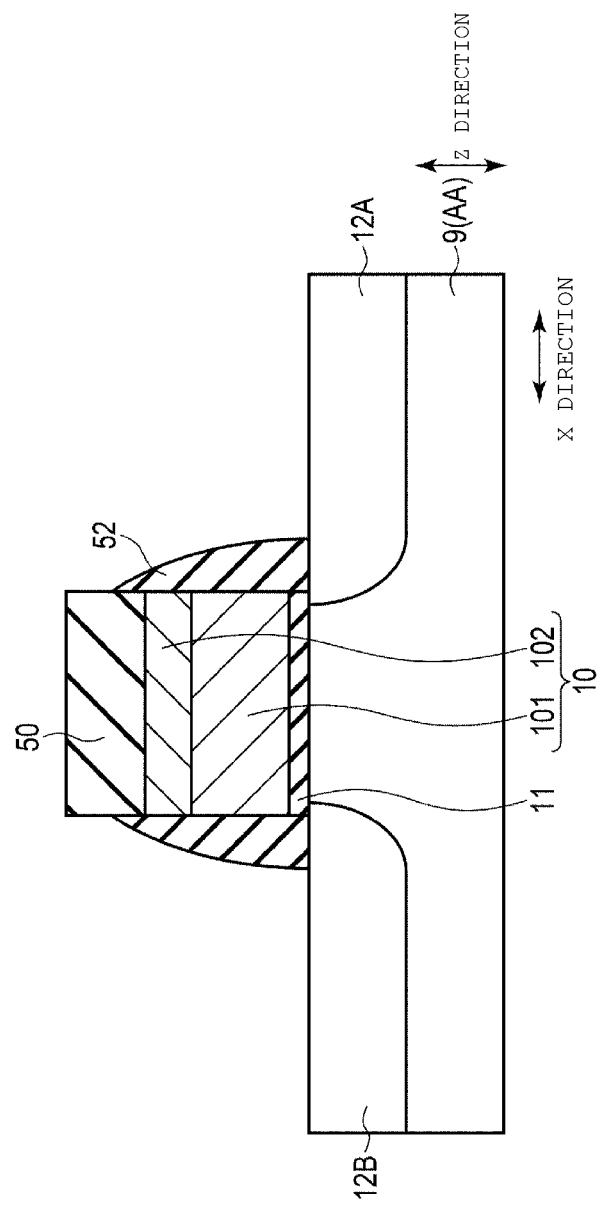
FIG. 7 is still another sectional process diagram illustrating a method for manufacturing a semiconductor device according to an embodiment.

Accordingly, as shown in FIG. 7, the sidewall insulating layer 52 is formed on side surfaces of the gate stacks 10 and 50 in a self-aligned manner.

Figure 8:
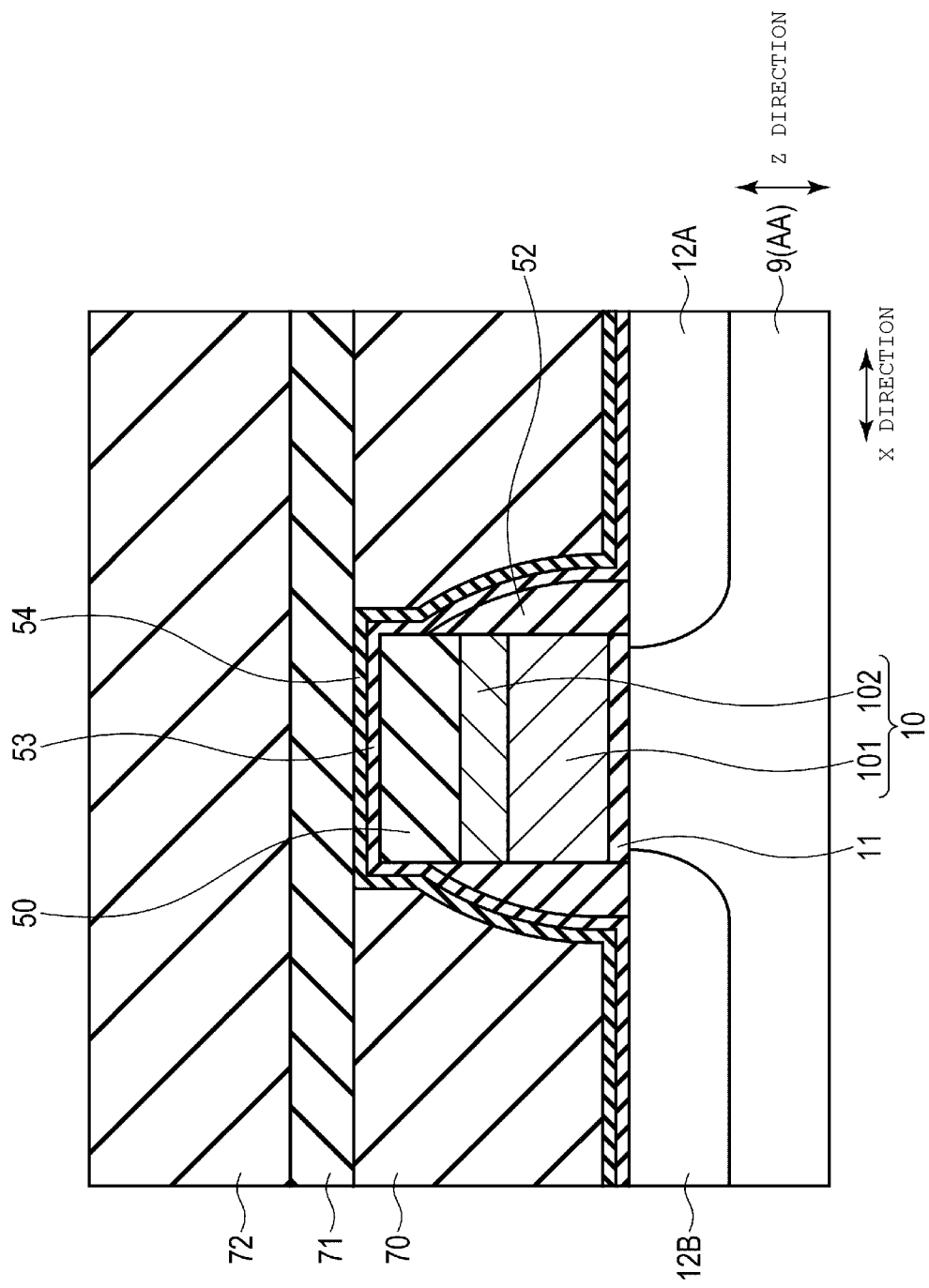
FIG. 8 is further still another sectional process diagram illustrating a method for manufacturing a semiconductor device according to an embodiment.

As shown in FIG. 8, an insulating layer 53 and an insulating layer 54 are sequentially formed on the semiconductor substrate 9 to cover the gate stacks 10 and 50 and the source or drain layer 12. The formed insulating layer may be one layer.

After the insulating layer 70 is formed, the upper portion of the insulating layer 70 is flattened by chemical mechanical polishing (CMP). Thereafter, the insulating layers 71 and 72 are sequentially formed on the insulating layer 70. Accordingly, the interlayer insulating film is formed on the semiconductor substrate 9 to cover the transistor 1.

Figure 9:
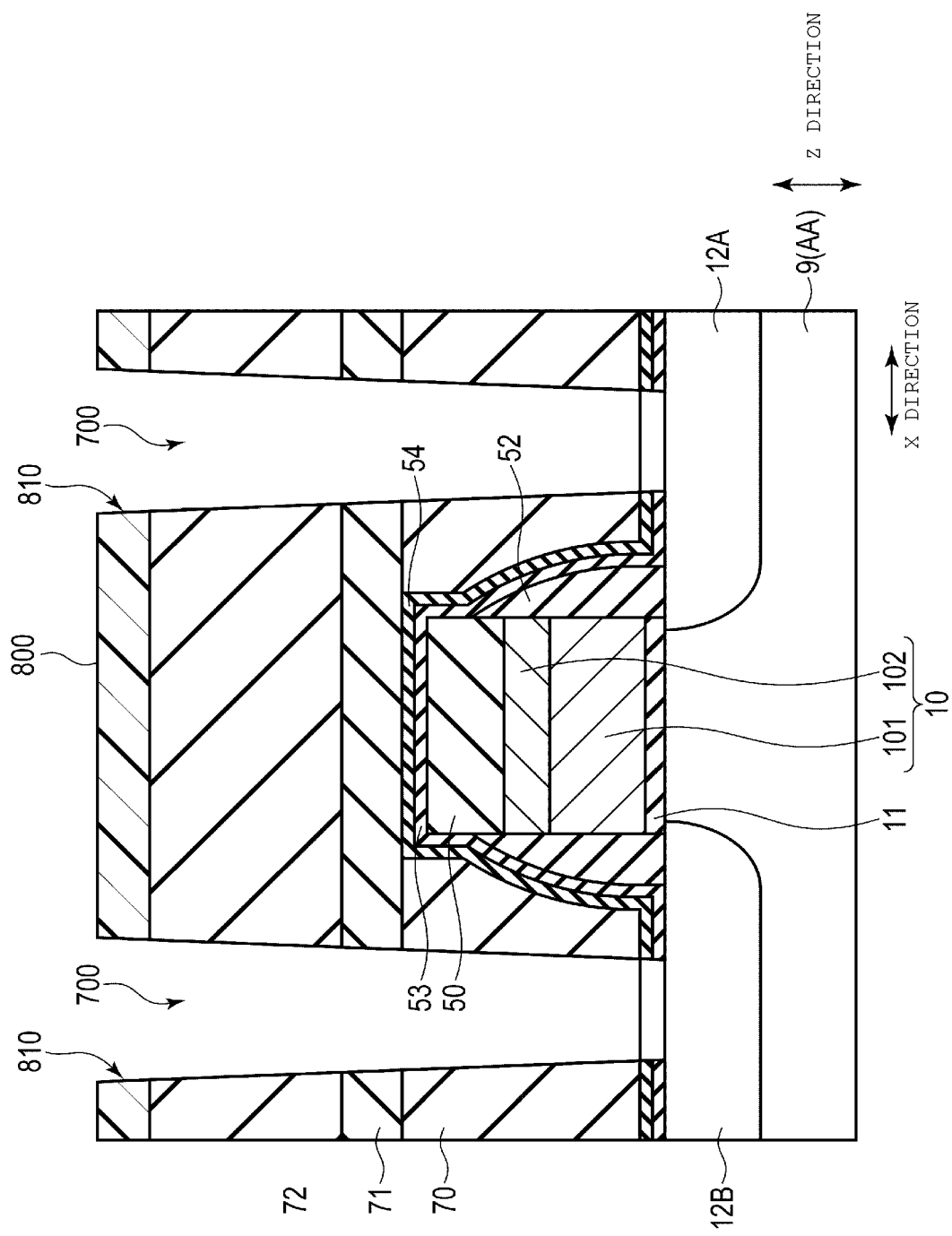
FIG. 9 is further still another sectional process diagram illustrating a method for manufacturing a semiconductor device according to an embodiment.

As shown in FIG. 9, the mask layer (for example, resist mask) 81 is formed on the insulating layer 72. The mask layer is patterned in a predetermined shape by the photolithography and the etching.

Accordingly, an opening pattern 810 is formed in the mask layer 81 in a selected formation region of the contact hole.

The insulating layers 70, 71, and 72 are etched by, for example, RIE based on a pattern 810 of the mask layer 81. Accordingly, the contact hole 700 is formed in the insulating layers 70, 71, and 72. The upper surfaces of the source or drain layers 12A and 12B are exposed via the contact hole 700.

For example, the contact hole 700 has a tapered shape. In the contact hole 700 of the tapered shape, the dimension of a bottom portion side (substrate side) of the contact hole 700 in the X direction is smaller than the dimension of an upper portion side (opposite side of substrate side in Z direction)

of the contact hole 700 (e.g., by a ratio of about 0.8 or less, about 0.5 or less, or about 0.3 or less).

Figure 10:
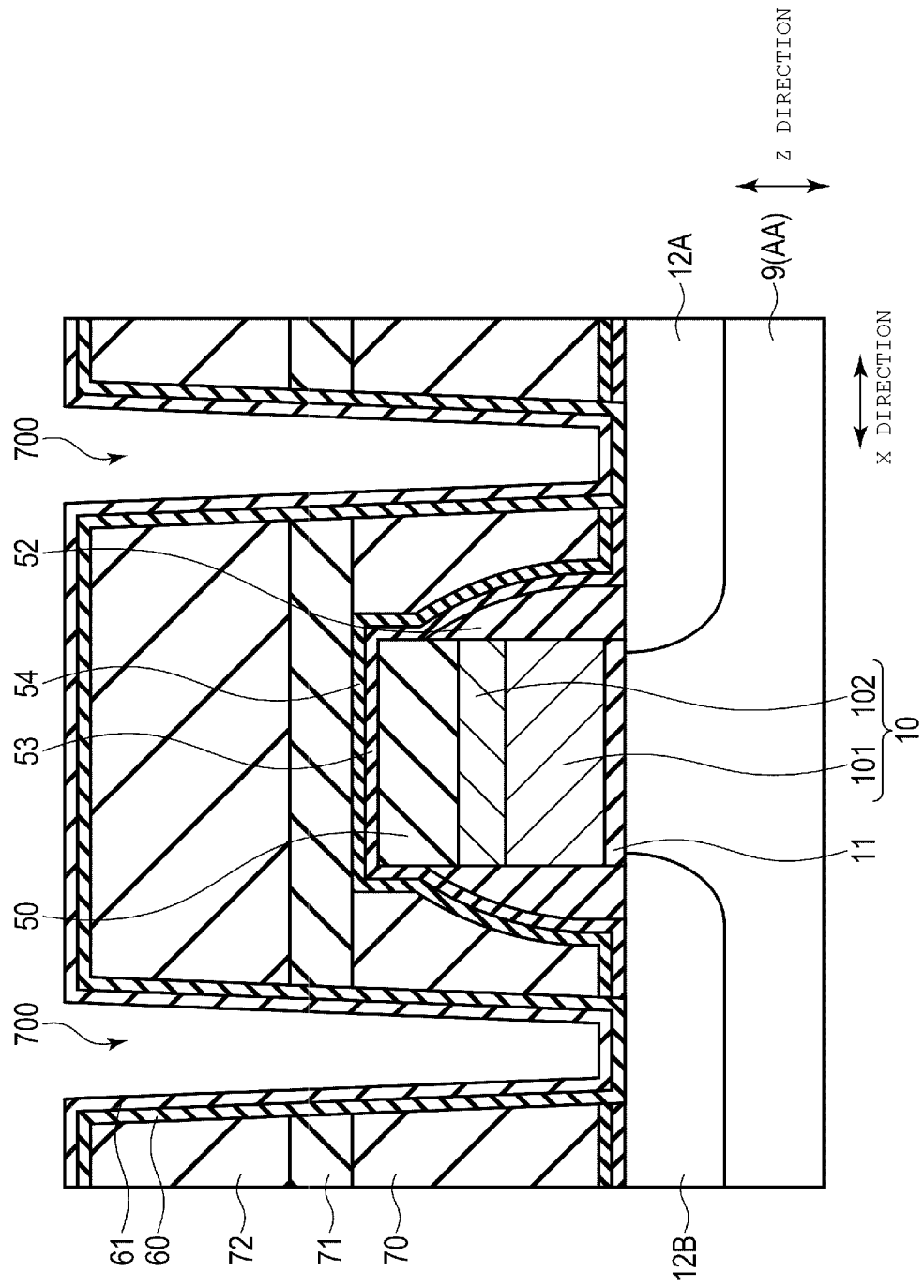
FIG. 10 is further still another sectional process diagram illustrating a method for manufacturing a semiconductor device according to an embodiment.

As shown in FIG. 10, a first spacer layer (insulating layer) 60 is formed on the insulating layers 70, 71, and 72 and the source or drain layer 12. A second spacer layer (insulating layer) 61 is formed on the first spacer layer 60. The first and second spacer layers 60 and 61 cover a side wall of the insulating layers 70, 71, and 72 in the contact hole 700.

The material included in the first spacer layer 60 is different from the material included in the second spacer layer 61. For example, the first spacer layer 60 includes the silicon nitride layer and the second spacer layer 61 includes the silicon oxide layer. However, the silicon nitride layer may be used in the second spacer layer 61 and the silicon oxide layer may be used in the first spacer layer 60.

The spacer layers 60 and 61 are formed by controlling the thickness of the spacer layers 60 and 61 to prevent or mitigate the contact hole 700 being buried or filled in by the spacer layers 60 and 61.

In FIG. 10, an example in which two spacer layers 60 and 61 are formed in the contact hole is shown. However, the number of the spacer layers formed in the contact hole may be one layer.

Figure 11:
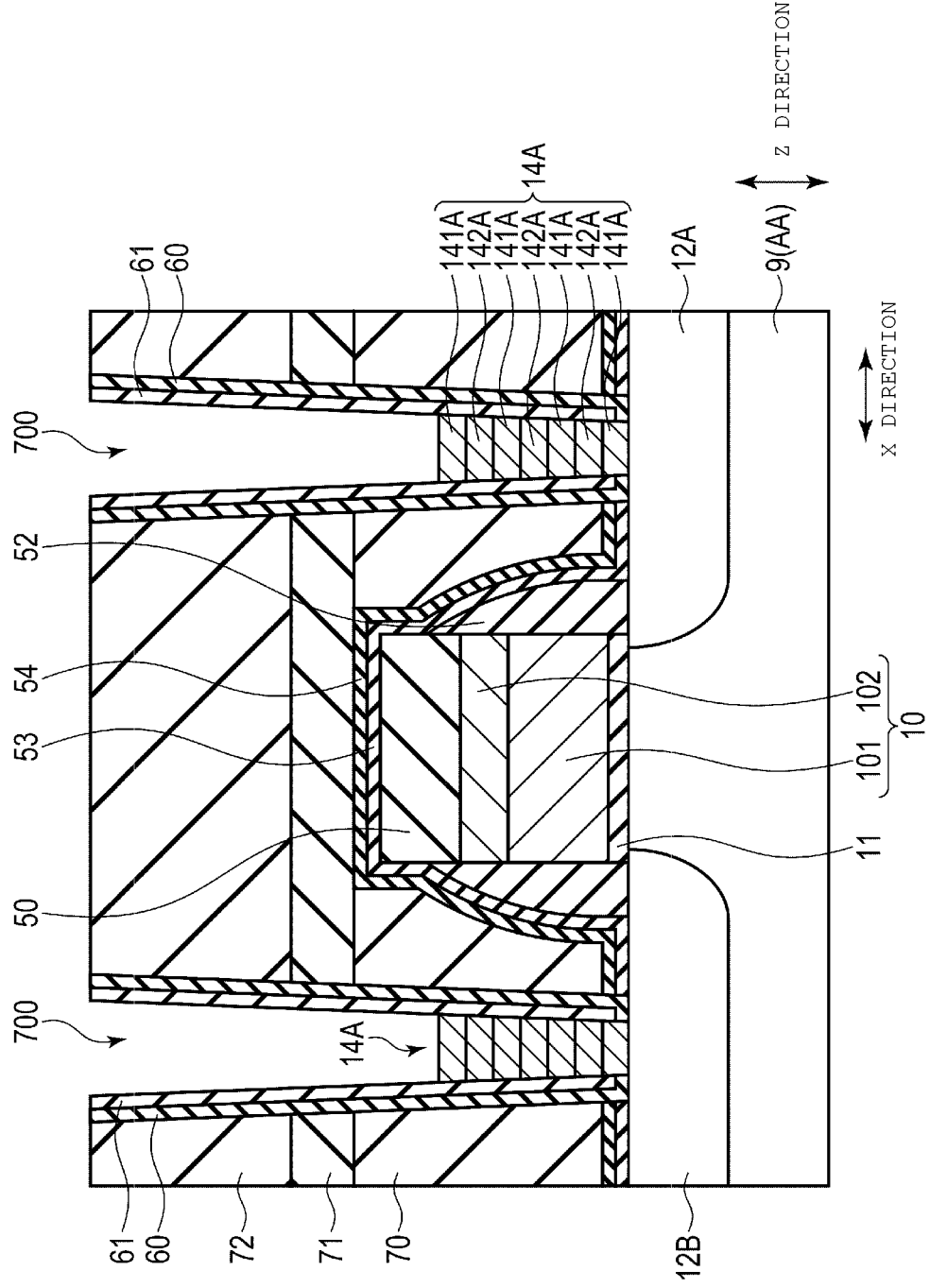
FIG. 11 is further still another sectional process diagram illustrating a method for manufacturing a semiconductor device according to an embodiment.

As shown in FIG. 11, the spacer layers 60 and 61 are removed from the upper surface of the source or drain layers 12A and 12B by anisotropic etching (for example, RIE). Accordingly, the upper surfaces of the source or drain layers 12A and 12B are exposed.

The spacer layers 60 and 61 remain on the side surface of the insulating layers 70, 71, and 72 in the contact hole 700.

A stacked body 14A is formed on the source or drain layer 12 such that a plurality of the first layers 141A and a plurality of the second layers 142A are alternately stacked in the Z direction. The first layer 141A is formed to directly contact the source or drain layer 12.

The material included in the first layer 141A is different from the material included in the second layer 142A. The materials of the first and second layers 141A and 142A are appropriately selected such that the desired etching selection ratio between the first layer 141A and the second layer 142A is achieved.

In this example, the SiGe layer is used in the first layer 141A and the Si layer is used in the second layer 142A.

For example, the first layer (SiGe layer) 141A of the lowermost layer of the stacked body 14A is a layer (epitaxial layer and crystal layer) epitaxially grown on the source or drain layers (for example, silicon layer to which B is doped) 12. The second layer (Si layer) 142A includes the layer epitaxially grown on the first layer 141A. In addition, the first layer 141A other than the lowermost layer is a layer epitaxially grown on the second layer 142A.

The Si layer may be used in the first layer 141A and the SiGe layer may be used in the second layer 142A. When the Si layer as the first layer is formed on the source or drain layer 12, the Si layer 141A of the lowermost layer may be a layer continuous with the source or drain layer 12 (or the silicon substrate 9).

In the plurality of the first layers 141A in the stacked body 14A, respective thicknesses of the first layers 141A may be substantially the same or different from each other. In the plurality of the first layers 141A in the stacked body 14A, respective dimensions D1 of the first layers 141A in the parallel direction to the front surface of the semiconductor substrate 9 may be substantially the same or different from each other. In the plurality of the second layers 142A in the stacked body 14A, respective thicknesses of the second layers 142A are substantially the same or different from each other. In the plurality of the second layers 142A in the stacked body 14A, respective dimensions D2 of the second layer 142A in the parallel direction to the front surface of the semiconductor substrate 9 may be the same or different from each other. For example, according to a shape of the contact hole 700, the stacked body 14A has the tapered shape. In the stacked body 14A of the tapered shape, the dimension of a lower side of the stacked body 14A in the Z direction is smaller than the dimension of an upper side of the stacked body 14A in the Z direction (e.g. by a ratio of about 0.8 or less, about 0.5 or less, or about 0.3 or less).

After the stacked body 14A is formed, the second spacer layer is selectively removed by etching (for example, wet etching).

Figure 12:
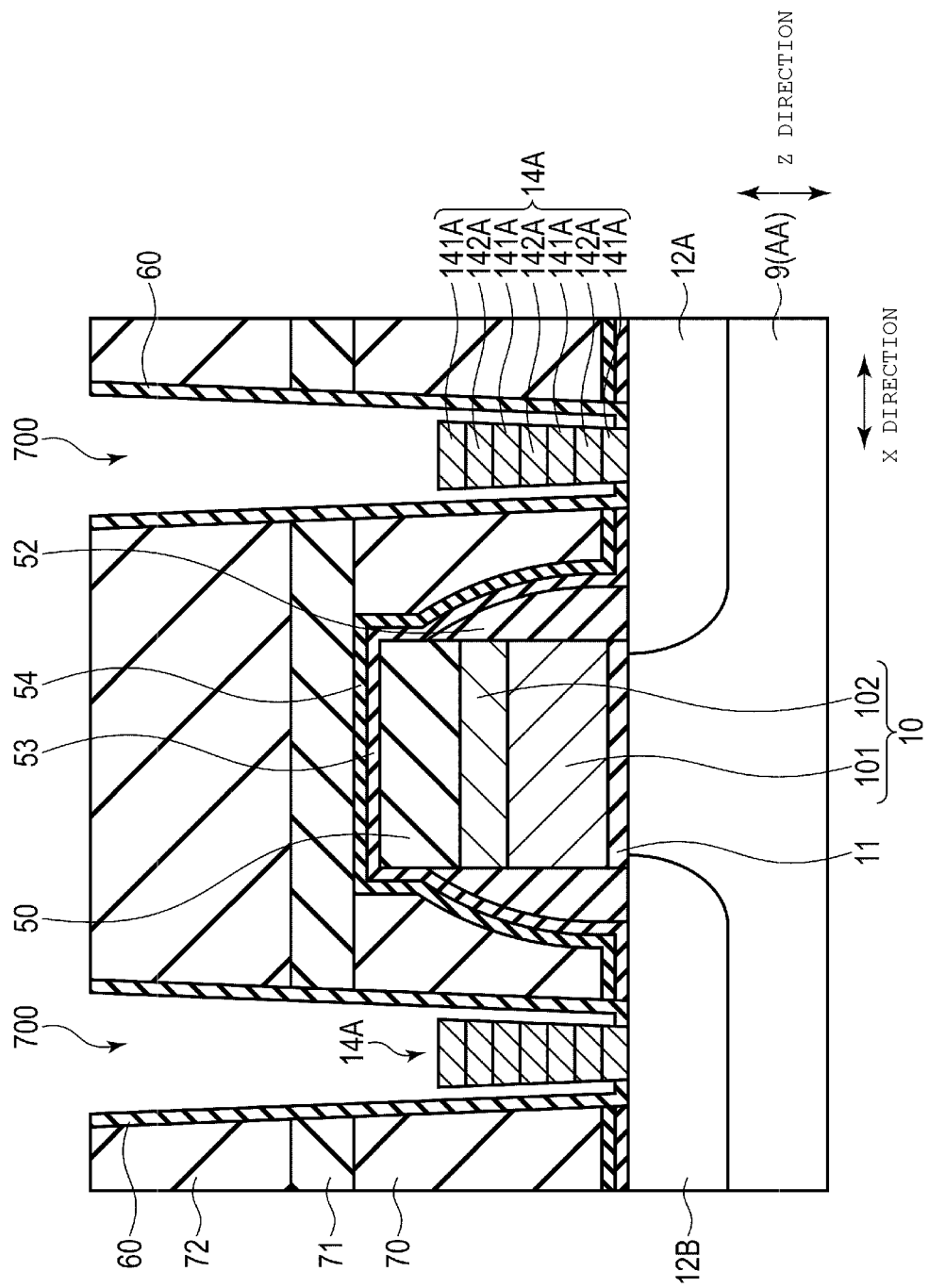
FIG. 12 is further still another sectional process diagram illustrating a method for manufacturing a semiconductor device according to an embodiment.

As shown in FIG. 12, by the removal of the second spacer layer, the space (gap) is formed between the first spacer layer 60 and the stacked body 14A. When the spacer layer is one layer, one spacer layer is removed from the inside of the contact hole and a void is formed between the stacked body 14A and the insulating layer 70.

Figure 13:
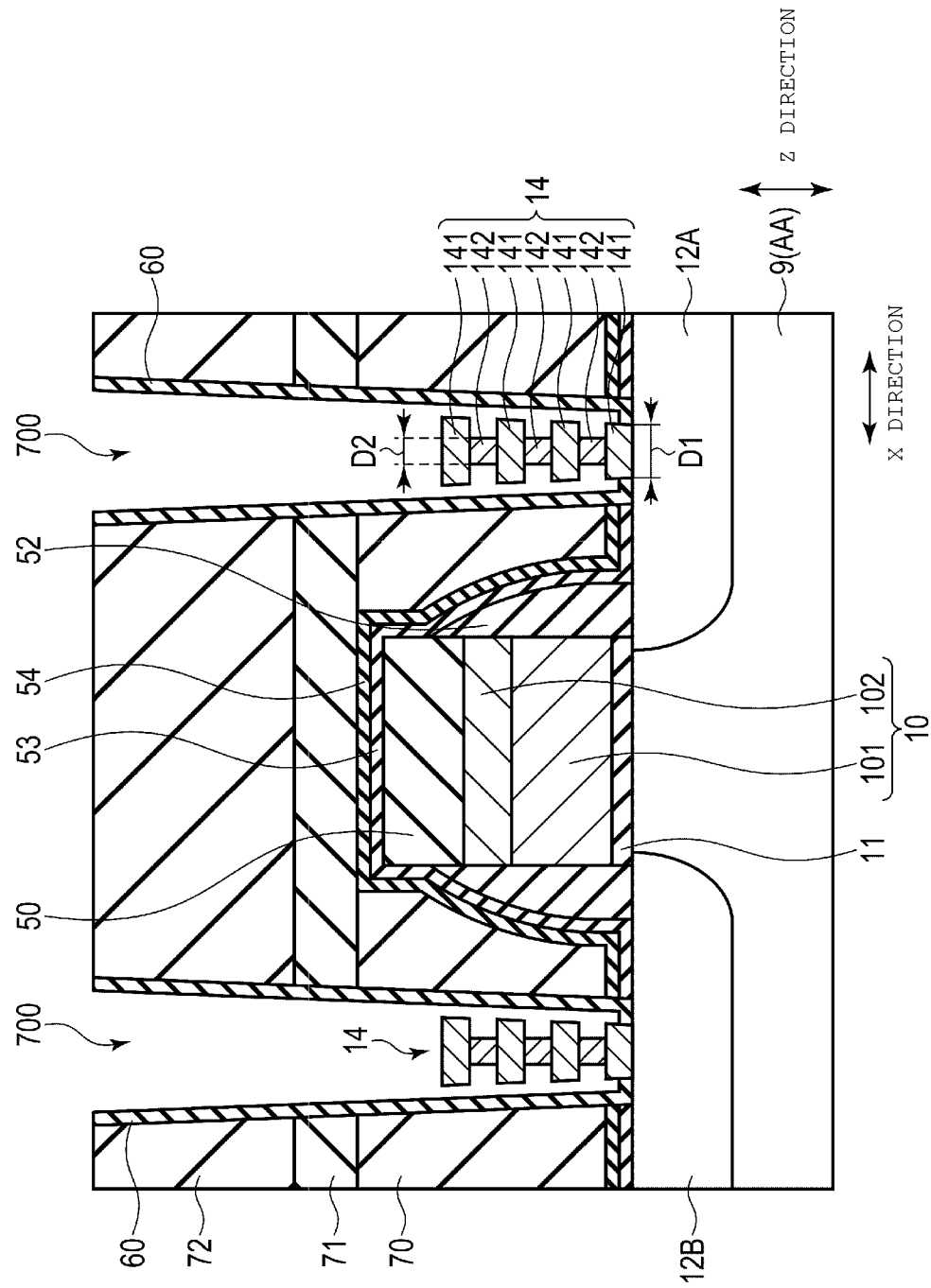
FIG. 13 is further still another sectional process diagram illustrating a method for manufacturing the semiconductor device according to an embodiment.

As shown in FIG. 13, for etching back on one of the first layer 141 and the second layer 142, one (here, the second layer) of the first layer and the second layer is selectively etched by isotropic etching (for example, wet etching).

Accordingly, a side surface (X direction of layer and surface in Y direction) of the second layer 142 is recessed in the parallel direction to the front surface of the semiconductor substrate 9. By the etching, in order not to fully remove the second layer 142 and not to cause a collapse of the pattern of the stacked body 14, etching conditions (for example, concentration of solution, etching time, and the like) on the second layer 142 are appropriately selected.

For example, in a case where the Si layer is etched, the Si layer is selectively etched by a KOH solution. In a case where the SiGe layer is etched, the SiGe layer is selectively etched by mixed solution of HF, $H_2O_2$ and $CH_3COOH$. When the SiGe layer is etched, by controlling a composition ratio of Si and Ge, a desired etching selection ration may be achieved between the Si layer and the SiGe layer. For example, if the composition ratio (x) of Ge in a $Si_{1-x}Ge_x$ layer is higher than 0.7, the SiGe layer is selectively etched by a mixed solution of $NH_4OH$ and $H_2O_2$.

As described above, with respect to the dimensions D1 and D2 of the first and second layers in the parallel direction (X direction and Y direction) to the front surface of the semiconductor substrate 9, the dimension D2 of the second layer (Si layer) 142 is smaller than the dimension D1 of the first layer (SiGe layer) 141. For example, D1 is larger than D2 by a factor of about 1.5 or more, about 2 or more, or about 3 or more, or by a factor in a range of about 1.1 to about 3.

For example, it is preferable that the thickness and the dimension of the layer and/or the conditions of the etching are appropriately set such that a ratio (D1/D2) of the dimension D1 and the dimension D2 is set in a range from about 1.1 to about 3.0.

As a result, the first contacts (stacked body) 14 including the recess 149 on the side surface are formed on the source or drain layer 12.

Figure 14:
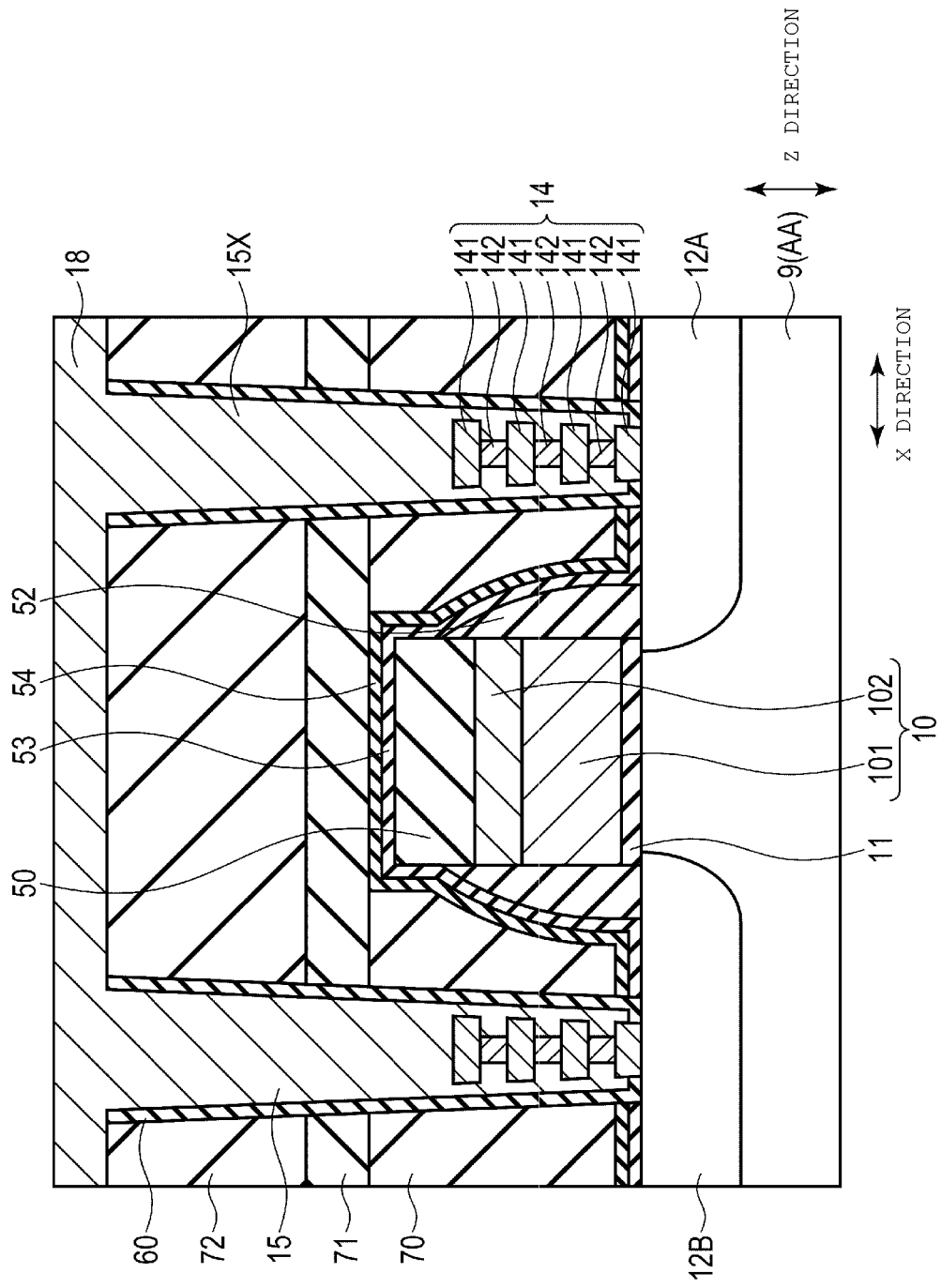
FIG. 14 is further still another sectional process diagram illustrating a method for manufacturing a semiconductor device according to an embodiment.

As shown in FIG. 14, a conductor (for example, a metal) 15A is formed on the contact 14, on the spacer layer 60, and on the insulating layer 72 to be buried or filled in the contact hole.

With respect to the conductor 15A, a planarization process (for example, CMP process) is performed by using the upper surface of the insulating layer 72 as a stopper.

Accordingly, as shown in FIG. 4, the second contact 15 is formed in the contact hole in a self-aligned manner.

The second contact 15 is in contact with the upper surface of the first contact 14 and side surface.

Furthermore, the protrusion portion 159 of the second contact 15 is in contact with the upper surface of the first layer 141 of a lower layer side and the lower surface of the first layer 141 of an upper layer side at a position (portion) corresponding to the second layer 142 of the first contact 14.

As described above, the contact area between the second contact 15 and the first contact 14 increases, as compared with an implementation in which the contact area between two contacts when the two contacts are in contact with each other only between the upper surface of one contact and the lower surface of the other contact.

Thereafter, the metal layer (wire) 18 having a predetermined pattern is formed on the insulating layer 72 and the contact 15 to be connected to the second contact 15.

For example, the formation of the contact 19 on the gate electrode 10 and the formation of the second contact 15 may be performed at approximately the same time, and may be performed at a timing different from a timing of the formation of the second contact 15.

As described above, the field effect transistor of the present embodiment may be formed.

C. Summary

In the semiconductor device of the present embodiment, the first contact 14 and the second contact 15 are connected to each other on the source or drain layer 12 of the field effect transistor 1.

The first contact 14 is in direct contact with the source or drain layer 12. The first contact 14 includes a structure in which the first layer 141 and the second layer 142 are alternately stacked. With respect to the dimensions of the first and second layers 141 and 142 in the parallel direction to the front surface of the semiconductor substrate 9, the dimension D2 of the second layer 142 is smaller than the dimension D1 of the first layer 141. For example, D1 is larger than D2 by a factor of about 1.5 or more, about 2 or more, or about 3 or more, or by a factor in a range of about 1.1 to about 3.

The second contact 15 is in direct contact with the upper surface of the first contact 14 (surface in parallel direction to front surface of semiconductor substrate 9) and the side surface (surface in parallel direction to front surface of semiconductor substrate 9).

In addition, because of the dimension difference between the first layer 141 and the second layer 142, the recess 149 is formed on the side surface of the first contact 14. In a portion of the recess 149, the contact 15 is in contact with the upper surface of the first layer 141 and the lower surface.

Accordingly, in the present embodiment, the contact area (facing area) between the first contact and the second contact increases. As a result, resistance (for example, contact resistance between contacts) between the wire 18 and the source or drain layer 12 is reduced.

By the reduction of the resistance between the wire and the source or drain layer, the field effect transistor of an embodiment can improve output characteristics of a drain current in the field effect transistor.

As described above, the semiconductor device of the present embodiment can improve the characteristics of a semiconductor device.

3. MODIFICATION EXAMPLE

Figure 15:
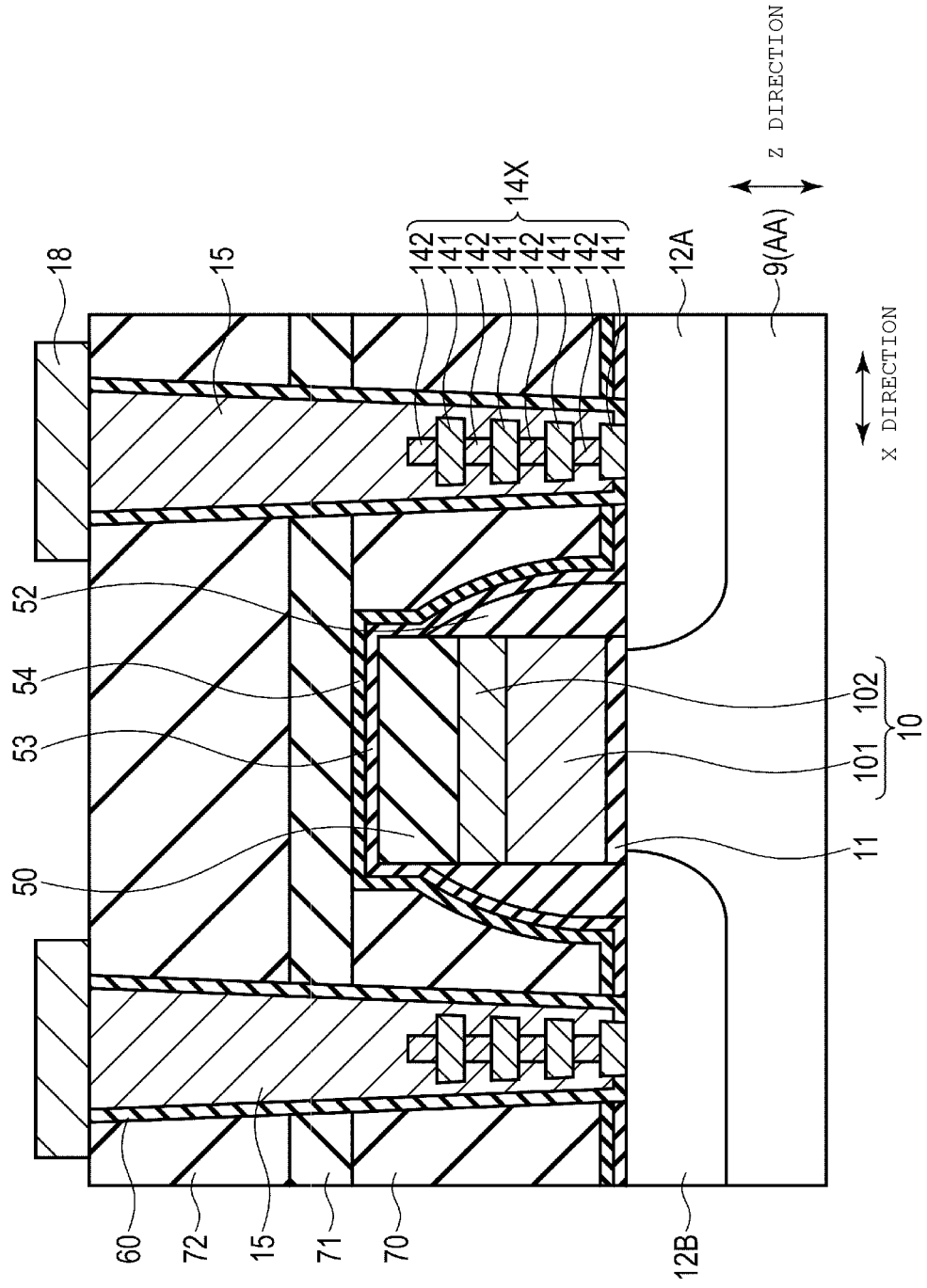
FIG. 15 is a sectional view illustrating a modification example of the semiconductor device according to an embodiment.
Figure 16:
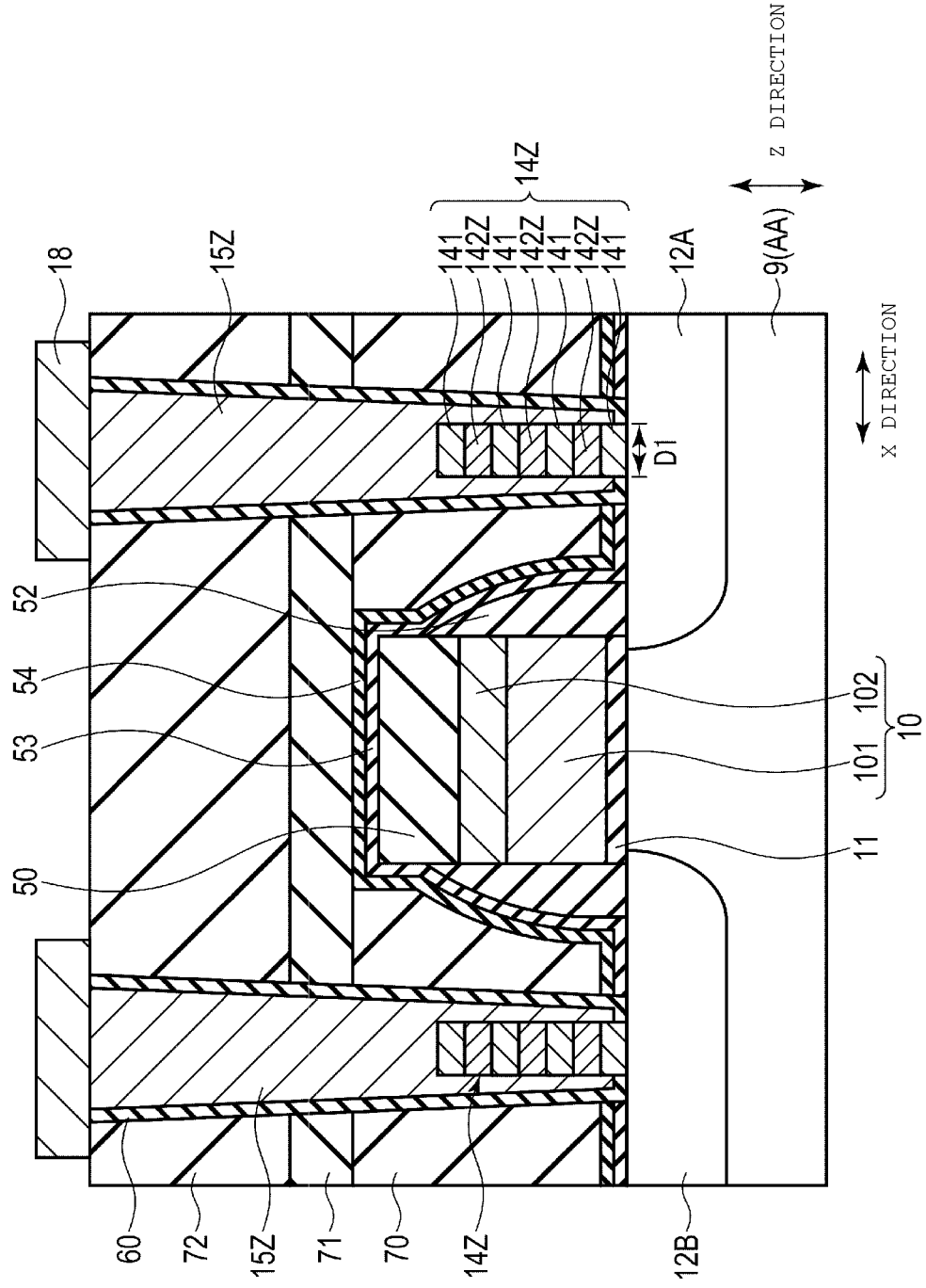
FIG. 16 is a sectional view illustrating another modification example of the semiconductor device according to an embodiment.

With reference to FIG. 15 and FIG. 16, a modification example of the field effect transistor of an embodiment will be described.

FIG. 15 is a sectional view showing a modification example of the field effect transistor according to an embodiment.

In the transistor of FIG. 15, in a stacked body of a first contact 14X, the number of the second layers 142 is the same as the number of the first layers 141.

In this case, a layer of the uppermost portion of the stacked body 14X includes the second layer 142. The dimension of the uppermost portion of the stacked body 14X in the parallel direction (X direction and Y direction) to the front surface of the semiconductor substrate 9 corresponds to the dimension D2 of the second layer.

In the modification example, when the number of the first layers 141 and the number of the second layers 142 are the same, the area of the uppermost second layer 142 is used as the contact area between the first contact 14X and the second contact 15.

As a result, in the field effect transistor of the present embodiment, the contact resistance between the first contact 14X and the second contact 15 (contact resistance between wire and source or drain layer) is reduced.

FIG. 16 is a sectional view showing another modification example of the field effect transistor of an embodiment.

In the transistor of FIG. 16, with respect to the dimension of the first and second layers 141 and 142Z in the parallel direction to the front surface of the semiconductor substrate 9, the dimension of the second layer 142Z is substantially the same as the dimension of the first layer 141.

In this case, a first contact 14Z does not include or define a recess. The second contact 15Z does not include a protrusion portion.

The second contact 15Z faces and is in contact with the upper surface and side surface of the first contact (stacked body) 14Z. When the dimension of the second layer 142Z is substantially the same as the dimension D1 of the first layer 141, the contact area between the second contact 15Z and the first contact 14Z satisfies $5\pi \times H \times D1 + \pi \times D1^2/4$.

Also, in an example of FIG. 16, the field effect transistor of the present embodiment can reduce the contact resistance between the wire and the transistor.

In an example of FIG. 16, the first contact 14A may be formed with one layer (semiconductor layer).

As described above, in the present embodiment, the field effect transistor of the modification example can improve the characteristics of the field effect transistor.

4. APPLICATION EXAMPLE

Figure 17:
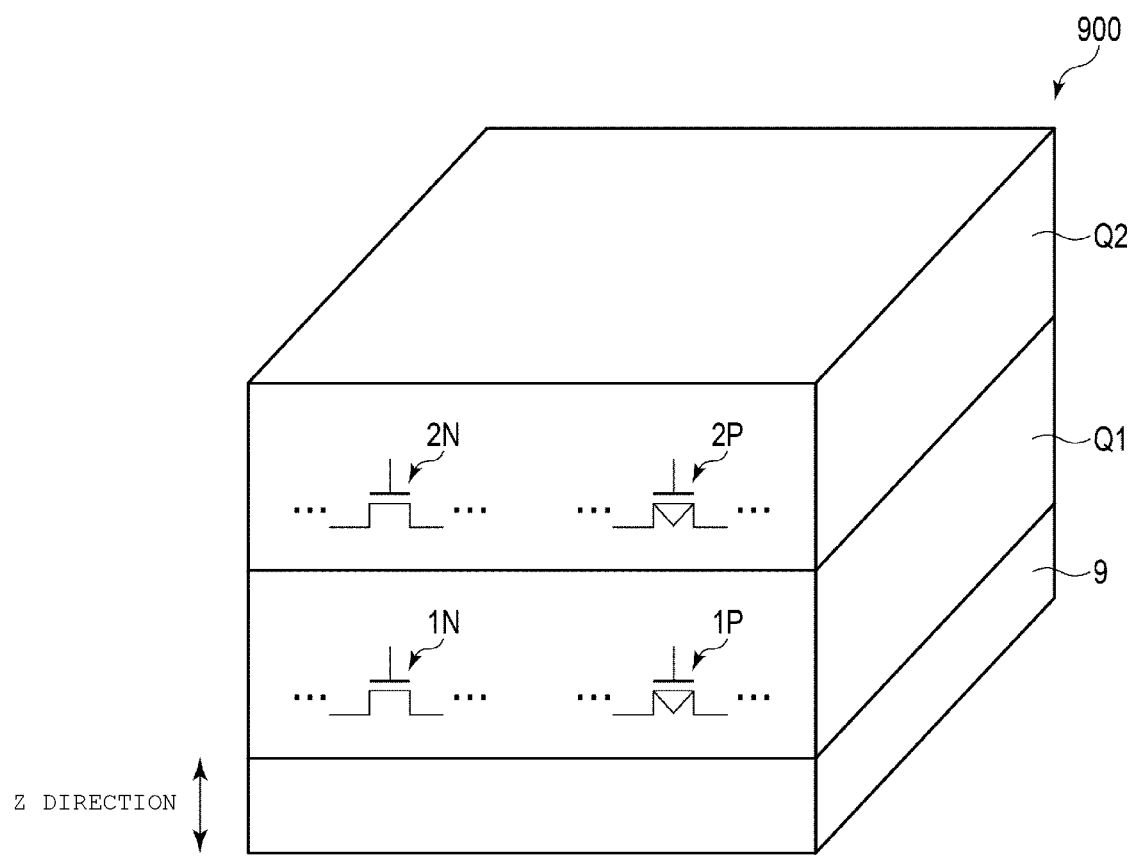
FIG. 17 is a schematic diagram illustrating an application example of a semiconductor device according to an embodiment.
Figure 18:
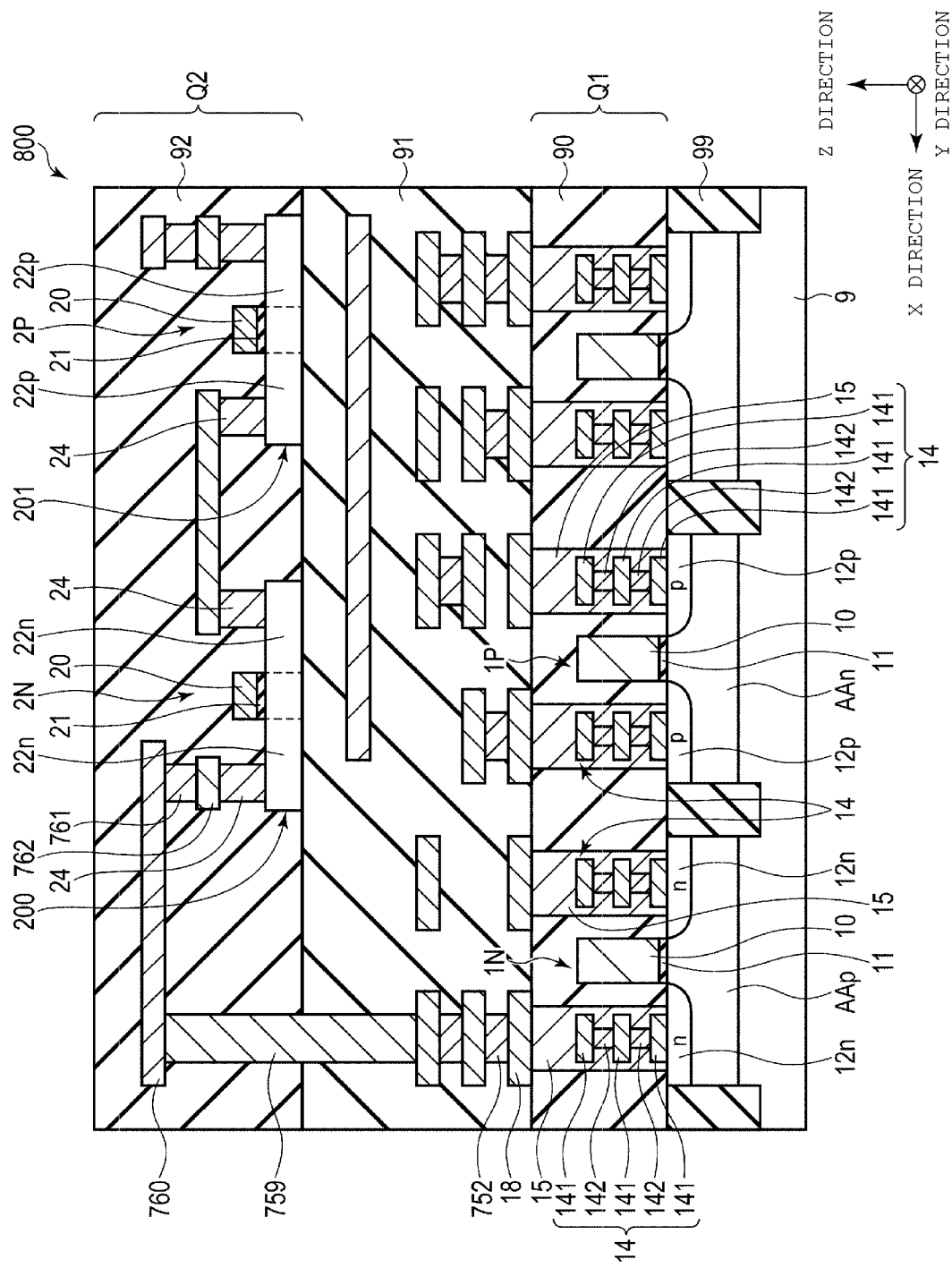
FIG. 18 is a schematic diagram illustrating another application example of the semiconductor device according to an embodiment.

With reference to FIG. 17 and FIG. 18, an application example of the field effect transistor of an embodiment will be described. FIG. 17 is a schematic diagram illustrating the application example of the field effect transistor of the present embodiment.

As shown in FIG. 17, a field effect transistor (1P and 1N) 1 of an embodiment is implemented in, for example, a semiconductor circuit 900.

For example, the semiconductor circuit 900 of the application example is selected from a semiconductor integrated circuit (for example, processor), a semiconductor analog circuit, a memory device (for example, NAND flash memory, resistance change memory, and the like), a sending device (for example, image sensor), and the like.

A plurality of n-type field effect transistors 1N according to an embodiment described herein and a plurality of p-type field effect transistors 1P according to an embodiment described herein are disposed on the semiconductor substrate 9. A circuit Q1 including the transistors 1N and 1P is formed on the semiconductor substrate 9.

For example, a layer including a circuit Q2 in the vertical direction (in Z direction) to the front surface of the semiconductor substrate 9 is stacked on a layer including the circuit Q1 including the transistors 1P and 1N of the present embodiment. The circuit Q2 is formed from a plurality of the n-type field effect transistors 2N and a plurality of the p-type field effect transistors 2P.

FIG. 18 is a sectional view illustrating an application example of the field effect transistor of the present embodiment.

As shown in FIG. 18, in the field effect transistor of the present embodiment, an n-type transistor 1N is provided on a p-type semiconductor region (p well region) AAp of the semiconductor substrate 9. The n-type transistor 1N includes the n-type source or drain layer 12n, and the first contact (for example, a semiconductor pillar) 14 disposed on the source or drain layer 12n includes the stacked structure of the plurality of the first layers 141 and the plurality of second layers 142. In the n-type transistor 1N, the second contact 15 is provided on the upper surface of the first contact 14 and on the side surface. The second contact 15 covers at least a portion of the upper surface of the first contact 14 and a side surface.

In addition, a p-type transistor 1P of the present embodiment is provided on the n-type semiconductor region (n-type well region) AAn in the semiconductor substrate 9. The p-type transistor 1P includes a p-type source or drain layer 12p.

In the p-type transistor 1P, the contact 14 on the source or drain layer 12p includes the stacked structure of the plurality of the first layers 141 and the plurality of second layers 142. The second contact 15 is provided on the upper surface of the first contact 14 and on the side surface so as to cover at least a portion of the upper surface of the first contact 14 and a side surface.

A material included in the first layer 141 and a material included in the second layer 142 of the contact 14 in the p-type transistor 1P may be different from the material included in the first layer 141 and the material included in the second layer 142 of the contact 14 in the n-type transistor 1N.

As described above, in the contact 14 of the stacked structure in the transistors 1N and 1P of the n-type and the p-type, the dimension of the second layer 142 in the parallel direction to the front surface of the semiconductor substrate 9 is smaller than the dimension of the first layer 141 in the parallel direction to the front surface of the semiconductor substrate 9. For example, the dimension of the first layer 141 is larger than the dimension of the second layer 142 by a factor of about 1.5 or more, about 2 or more, or about 3 or more, or by a factor in a range of about 1.1 to about 3.

Accordingly, as described above, by the dimension difference between the first layer 141 and the second layer 142, the contact area between the second contact 15 and the first contact 14 increases.

As a result, in the circuit Q1 and the transistor 1, the resistance between the wire 18 and the source or drain layer 12 can be reduced.

The transistors 1N and 1P and the front surface of the semiconductor substrate 9 (upper surface) of the present embodiment is covered by an interlayer insulating film 90.

A plurality of the field effect transistors 2N and 2P are provided above the interlayer insulating film 90 in the Z direction. The transistors 2N and 2P are stacked above the transistors 1N and 1P of the present embodiment in the Z direction.

The transistors 2N and 2P are formed on a semiconductor region 200 on an interlayer insulating film 91. For example, the semiconductor region 200 includes the semiconductor layer formed on the interlayer insulating film 91 by a CVD method.

The n-type transistor 2N includes the source or drain layer 22n in the semiconductor region (for example, a p-type semiconductor layer) 200. A gate electrode 20 is provided on the channel region between two source or drain layers 22n via the gate insulating film 21.

The p-type transistor 2P includes the source or drain layer 22p in the semiconductor region (for example, an n-type semiconductor layer) 201. The gate electrode 20 is provided on the channel region between two source or drain layers 22n via the gate insulating film 21.

In the n-type and the p-type transistors 2N and 2P, the contact 24 is connected to each of the source or drain layers 22n and 22p. The contact 24 is connected to a wire 762.

The transistors 2N and 2P of the circuit Q2 of the upper layer are electrically connected to the transistors (e.g., a transistor of described herein) 1N and 1P of the circuit Q1 of the lower layer by using a plurality of the contacts 752, 759, and 761, and a plurality of the wires 760 in the interlayer insulating films 91 and 92.

Accordingly, a semiconductor circuit 900 with improved capabilities is formed.

The transistors 2N and 2P may be formed on another different semiconductor substrate stacked on the semiconductor substrate 9. In this case, a plurality of the semiconductor substrates (including, for example, semiconductor chip) are bonded by an adhesive layer. The circuits Q1 and Q2, and the transistors 1 and 2 of each semiconductor substrate are electrically connected to each other by a TSV or a redistribution layer.

As described above, in the transistor 1 (1N and 1P) of the present embodiment, it is possible to increase the contact area between the two contacts 14 and 15. As a result, in a semiconductor circuit of the present application example, it is possible to reduce the contact resistance between the transistor 1 and the wire 18.

In addition, as in the semiconductor circuit 900 of FIG. 17 and FIG. 18, in order to form an element 2 and the circuit Q2 on the interlayer insulating film 91, when a relatively high-temperature semiconductor process is performed after the formation of the transistor on the semiconductor substrate 9, the resistance between the source or drain layer and the contact may increase due to a chemical reaction (for example, binding and/or decomposition) between the impurities (for example, boron) in the source or drain layer and the metal (for example, titanium) forming the contact.

In the present embodiment, the contact 14 in contact with the source or drain layer 12 is configured with the semiconductor layers 141 and 142. Therefore, in the semiconductor circuit 900 including the field effect transistor 1 of the present embodiment, it is possible to prevent or mitigate the chemical reaction between the impurities (dopants) of the source or drain layer 12 due to the heat treatment and the metal of the contact, and the increase of the resistance between the wire and the transistor due to the chemical reaction is prevented.

Accordingly, in the semiconductor circuit 900 using the field effect transistor 1, in forming the element 2 and the circuit Q2 on the interlayer insulating films 90 and 91, even if the relatively high-temperature semiconductor process is performed, it is possible to prevent or mitigate an increase of the resistance between the source or drain layer 12 and the contacts 14 and 15.

As described above, the semiconductor circuit 900 can provide for improved characteristics.

5. OTHERS

In some embodiments, as the semiconductor device, the field effect transistor having a planar structure is provided by way of example. However, the above-described contacts 14 and 15 used in the semiconductor device of the present embodiment may be applied to a field effect transistor including a gate structure other than the planar structure.

In addition, in some embodiments of the semiconductor device, the structure of the contacts 14 and 15 described above may be implemented with an element using a semiconductor layer such as a resistance element and/or a capacitance element.

As used herein, the terms "about," "approximately," and "substantially" are used to describe and account for small variations. When used in conjunction with an event or circumstance, the terms "about," "approximately," and "substantially" can refer to instances in which the event or circumstance occurs precisely as well as instances in which the event or circumstance occurs to a close approximation. For example, when used in conjunction with a numerical value, the terms "about," "approximately," and "substantially" can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor device comprising:
   a semiconductor substrate;
   a first source or drain layer and a second source or drain layer that are provided in the semiconductor substrate;
   a gate insulation layer provided on a portion of a surface of the semiconductor substrate located between the first and second source or drain layers;
   a gate electrode that is provided on the gate insulation layer;
   a first contact that is provided on the first source or drain layer and a first contact that is provided on the second source or drain layer, each of the first contacts including a stacked body in which a plurality of first layers and one or more second layers are alternately stacked; and
   a second contact that faces at least one of a side surface and an upper surface of the first contact disposed on the first source or drain layer, or faces a side surface and an upper surface of the first contact disposed on the second source or drain layer,
   wherein a dimension of the one or more second layers in a direction parallel to the surface of the semiconductor substrate is smaller than a dimension of the first layers in the direction parallel to the surface of the semiconductor substrate.

2. The semiconductor device according claim 1, wherein the dimension of the first layers is larger than the dimension of the one or more second layers by a factor in a range of 1.1 to 3.

3. The semiconductor device according to claim 1, wherein a portion of the second contact is provided between two of the first layers and adjacent to one of the one or more second layers.

4. The semiconductor device according to claim 1, wherein one or more recesses are defined by a side surface of the first contact at a position adjacent to one of the one or more second layers.

5. The semiconductor device according to claim 1, wherein a dimension of the one or more second layers in a direction parallel to the surface of the semiconductor substrate is greater than a dimension of the first layers in a direction parallel to the surface of the semiconductor substrate.

6. The semiconductor device according to claim 5, wherein the dimension of the one or more second layers is larger than the dimension of the first layers by a factor in a range of 1.1 to 3.

7. The semiconductor device according to claim 1, wherein a material included in the first layer is different from a material included in the second layer.

8. The semiconductor device according to claim 1,
   wherein the first layers include a first semiconductor layer,
   the one or more second layers include a second semiconductor layer different from the first semiconductor layer, and
   the second contact includes at least one of a metal and a conductive compound.

9. A semiconductor device comprising:
   a semiconductor substrate comprising a source or drain layer adjacent to a surface of the semiconductor substrate;
   a first contact provided on the first source or drain layer comprising a plurality of first layers and one or more second layers, the first layers and the one or more second layers being alternately stacked, and a side surface of the first contact defining one or more recesses; and
   a second contact disposed around the first contact and in the one or more recesses,
   wherein a dimension of the one or more second layers in a direction parallel to the surface of the semiconductor substrate is smaller than a dimension of the first layers in the direction parallel to the surface of the semiconductor substrate.

10. The semiconductor device according to claim 9, wherein the dimension of the first layers is larger than the dimension of the one or more second layers by a factor in a range of 1.1 to 3.

11. The semiconductor device according to claim 9, wherein the first layers each comprise at least one of silicon (Si), germanium (Ge), and silicon germanium (SiGe).

12. The semiconductor device according to claim 9, wherein the one or more second layers each comprise at least one of silicon (Si), germanium (Ge), and silicon germanium (SiGe).

13. The semiconductor device according to claim 9, wherein the second contact comprises at least one of titanium (Ti), tungsten (W), and titanium nitride (TiN).

* * * * *